US010687436B2

(12) United States Patent
Franck et al.

(10) Patent No.: US 10,687,436 B2
(45) Date of Patent: Jun. 16, 2020

(54) MEDIA ENCLOSURES AND RELATED ASSEMBLIES AND SYSTEMS

(71) Applicant: WirePath Home System, LLC, Charlotte, NC (US)

(72) Inventors: Christopher Glenn Franck, Fort Mill, SC (US); William Jacob Kozlowski, Jr., Waxhaw, NC (US); Jamie Lee Quinlan, Charlotte, NC (US); Matthew R. Shute, Huntersville, NC (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 0 days.

(21) Appl. No.: 16/023,384

(22) Filed: Jun. 29, 2018

(65) Prior Publication Data

US 2018/0310430 A1 Oct. 25, 2018

Related U.S. Application Data

(62) Division of application No. 15/083,945, filed on Mar. 29, 2016, now Pat. No. 10,021,807.

(60) Provisional application No. 62/140,935, filed on Mar. 31, 2015, provisional application No. 62/173,714, filed on Jun. 10, 2015.

(51) Int. Cl.
| | |
|---|---|
| *G06F 1/16* | (2006.01) |
| *H05K 5/00* | (2006.01) |
| *H05K 7/00* | (2006.01) |
| *H05K 7/18* | (2006.01) |
| *H02G 3/08* | (2006.01) |
| *H02B 1/48* | (2006.01) |

(52) U.S. Cl.
CPC ............... *H05K 7/18* (2013.01); *H02G 3/081* (2013.01); *H02B 1/48* (2013.01)

(58) Field of Classification Search
CPC    H05K 7/18; H05K 7/183; H05K 7/14; H05K 7/1401; H05K 7/1417; H05K 7/00; H02G 3/081; H02B 1/40; H02B 1/42
USPC ...................... 361/724–727, 679.01, 679.02; 312/223.1–223.3
See application file for complete search history.

(56) References Cited

U.S. PATENT DOCUMENTS

| | | | |
|---|---|---|---|
| 3,566,194 A | * | 2/1971 | Gryctko ................. H02B 1/056 361/652 |
| 4,631,634 A | | 12/1986 | Raabe et al. |
| 4,783,718 A | * | 11/1988 | Raabe ...................... H02B 1/42 361/634 |
| 4,850,014 A | | 7/1989 | Gillis et al. |
| 5,024,614 A | | 6/1991 | Dola et al. |
| (Continued) | | | |

*Primary Examiner* — Anthony M Haughton
(74) *Attorney, Agent, or Firm* — Austin Rapp

(57) ABSTRACT

A structured media enclosure door assembly includes a base, a door and a support plate. The base includes a frame that is configured to mount directly to a wall. The door includes a frame and a front panel held by the door frame. The door frame is coupled to the base frame. The support plate has first and second opposite surfaces. The support plate is configured to be selectively coupled to the door frame in: (i) a first position with the support plate first surface facing the front panel and the support plate spaced apart from the front panel a first distance; and (ii) a second position with the support plate second surface facing the front panel and the support plate spaced apart from the front panel a second distance that is less than the first distance.

12 Claims, 28 Drawing Sheets

(56) References Cited

U.S. PATENT DOCUMENTS

| | | | | |
|---|---|---|---|---|
| 5,072,071 | A | * | 12/1991 | Cassity .................. H02B 1/056 |
| | | | | 174/135 |
| 5,134,543 | A | * | 7/1992 | Sharp .................... H02B 1/056 |
| | | | | 361/644 |
| 5,274,731 | A | | 12/1993 | White |
| 5,463,533 | A | * | 10/1995 | Donnerstag ............ H02B 1/015 |
| | | | | 174/57 |
| 5,640,295 | A | | 6/1997 | Harris et al. |
| 5,721,667 | A | | 2/1998 | Rose |
| RE35,929 | E | | 10/1998 | Daoud |
| 7,075,005 | B1 | * | 7/2006 | Drane .................... H02G 3/185 |
| | | | | 174/50 |
| 7,109,414 | B2 | | 9/2006 | Reynolds |
| 7,119,282 | B2 | * | 10/2006 | Krietzman ............. H02G 3/045 |
| | | | | 174/101 |
| 7,362,941 | B2 | * | 4/2008 | Rinderer ................ H05K 7/186 |
| | | | | 385/134 |
| 7,423,215 | B2 | * | 9/2008 | Cardenas ............... H02G 3/121 |
| | | | | 174/480 |
| 7,589,277 | B2 | * | 9/2009 | Kessler .................. H05K 5/0247 |
| | | | | 174/480 |
| 7,619,160 | B2 | | 11/2009 | Grunwald et al. |
| 7,660,409 | B1 | | 2/2010 | Czerwiec et al. |
| 7,975,976 | B2 | | 7/2011 | Wohlford |
| 8,324,503 | B2 | | 12/2012 | Pastoriza et al. |
| 8,355,246 | B2 | * | 1/2013 | Linhares, Jr. ...... H05K 7/20736 |
| | | | | 312/223.1 |
| 8,365,936 | B2 | * | 2/2013 | Cox ........................ H02B 1/48 |
| | | | | 174/520 |
| 8,702,184 | B2 | | 4/2014 | Lakoduk et al. |
| 8,830,657 | B2 | * | 9/2014 | Myers ................... H02G 3/125 |
| | | | | 361/633 |
| 9,370,117 | B2 | * | 6/2016 | Franck .................... H05K 7/14 |
| 9,882,362 | B2 | | 1/2018 | Carapella et al. |
| 10,270,236 | B2 | | 4/2019 | Franck et al. |
| 2002/0139555 | A1 | | 10/2002 | Dodds et al. |
| 2006/0278422 | A1 | | 12/2006 | Drane |
| 2008/0078133 | A1 | * | 4/2008 | Remmert ............... H02G 3/081 |
| | | | | 52/281 |
| 2009/0249705 | A1 | | 10/2009 | Struthers et al. |
| 2009/0314907 | A1 | | 12/2009 | Romerein et al. |
| 2010/0206048 | A1 | | 8/2010 | Locke |
| 2011/0310534 | A1 | | 12/2011 | Cosley et al. |
| 2013/0002096 | A1 | | 1/2013 | Umeki et al. |
| 2013/0321715 | A1 | | 12/2013 | Millson et al. |
| 2014/0160717 | A1 | | 6/2014 | Malzone, Jr. et al. |
| 2015/0049452 | A1 | * | 2/2015 | Franck .................... H05K 7/14 |
| | | | | 361/809 |
| 2015/0096239 | A1 | | 4/2015 | Frogness |
| 2017/0138576 | A1 | | 5/2017 | Peng et al. |

\* cited by examiner

MEDIA ENCLOSURES AND RELATED ASSEMBLIES AND SYSTEMS

RELATED APPLICATIONS

This application is a divisional of U.S. application Ser. No. 15/083,945, filed Mar. 29, 2016, which application claims priority to U.S. Provisional Application No. 62/140,935, filed Mar. 31, 2015, and also claims priority to U.S. Provisional Application No. 62/173,714, filed Jun. 10, 2015, the disclosure of each of which is incorporated by reference in its entirety.

BACKGROUND

Structured wiring enclosures or "cans" are typically recessed in walls. Known enclosures have limited capability and versatility with regard to mounting electronic devices and/or cable or wire management.

Enclosure door covers or enclosure doors typically mount to an underlying enclosure. Known covers or doors for structured wiring enclosures do not provide substantial functionality beyond covering and providing access to the enclosure.

SUMMARY

Some embodiments of the invention are directed to a structured media enclosure door assembly. The assembly includes a base having a frame, with the base frame configured to mount directly to a wall. The assembly includes a door having a frame and a front panel held by the door frame, with the door frame coupled to the base frame. The assembly includes a support plate having first and second opposite surfaces, with the support plate configured to be selectively coupled to the door frame in: (i) a first position with the support plate first surface facing the front panel and the support plate spaced apart from the front panel a first distance; and (ii) a second position with the support plate second surface facing the front panel and the support plate spaced apart from the front panel a second distance that is less than the first distance.

In some embodiments, the assembly includes a plurality of standoffs on the door frame. The support plate may include a primary plate portion having the first and second opposite sides and at least one tab at each of opposing edges of the primary plate portion. Each tab may extend away from the primary plate portion at an angle, and each tab may be configured to couple with a respective one of the standoffs on the frame.

In some embodiments, the support plate includes a plurality of apertures defined therein for mounting one or more electronic devices. The support plate may include a plurality of resilient fingers extending from an edge thereof, with the plurality of fingers defining a plurality of openings between adjacent ones of the fingers, and with the openings configured to receive cable associated with the one or more electronic devices therethrough.

The base frame may include a top panel, a bottom panel and first and second opposite side panels. The door frame may include a top panel, a bottom panel and first and second opposite side panels. The first side panel of the door frame may be pivotably coupled to the first side panel of the base frame. The door may be pivotable relative to the base between a closed position wherein the second side panel of the door is adjacent the second side panel of the base and an open position wherein the second side panel of the door is spaced apart from the second side panel of the base.

In some embodiments, in the closed position, a gap is defined between the top panels of the base and door frames and/or between the bottom panels of the base and door frames.

In some embodiments, in the closed position, the base and door frames stand off the wall such that the support plate is spaced apart from a plane defined by the wall when the support plate is in the first or the second position.

In some embodiments, the door is pivotably coupled to the base by a plurality of hinge mechanisms that are coupled to the first side panel of the base, and the base and the plurality of hinge mechanisms are configured such that the plurality of hinge mechanisms can be decoupled from the first side panel of the base and coupled to the second side panel of the base to reverse a swing direction of the door.

In some embodiments, at least the door frame is polymeric.

Some other embodiments of the invention are directed to a structured media enclosure system. The system includes an enclosure assembly including a housing that is sized and configured to be recessed in a wall and mounted to adjacent studs in an installed position, e.g., studs that are spaced apart about 16 inches on center. The system includes a door assembly including a base and a door coupled to the base, with the base being sized and configured to be mounted to the wall such that the base surrounds the housing in the installed position.

In some embodiments, the enclosure assembly housing includes a back wall, a bottom wall, a top wall, and first and second sidewalls defining a cavity. The enclosure assembly may include a support plate releasably held in the housing with at least a major portion of the support plate parallel to and spaced apart from the back wall.

In some embodiments, the enclosure assembly includes at least one hinge clip on each of the first and second sidewalls with the support plate releasably held by the hinge clips.

In some embodiments, the hinge clips and the support plate are configured such that the support plate can be selectively pivoted at either the at least one hinge clip on the first sidewall or at the at least one hinge clip on the second sidewall.

In some embodiments, the support plate has first and second opposite sides, and the hinge clips and/or the support plate are configured such that the support plate can be selectively positioned in the housing cavity: in a first position with the first side of the support plate facing the back wall of the housing and the support plate spaced apart from the back wall a first distance; and in a second position with the second side of the support plate facing the back wall of the housing and the support plate spaced apart from the back wall a second distance that is less than the first distance. The hinge clips and/or the support plate may be configured such that the support plate can be selectively positioned in the housing cavity: in a third position with the first side of the support plate facing the back wall of the housing and the support plate spaced apart from the back wall a third distance that is less than the second distance; and in a fourth position with the second side of the support plate facing the back wall of the housing and the support plate spaced apart from the back wall a fourth distance that is less than the third distance.

In some embodiments, each hinge clip includes a clip member, and the hinge clips are configured to be reversibly mounted to the first and second sidewalls in a first configuration and a second configuration, with the clip member being closer to the housing back wall in the second configuration than in the first configuration. The hinge clips may be in the first configuration with the support plate in the first and second positions and in the second configuration with the support plate in the third and fourth positions.

In some embodiments, the enclosure assembly includes a removable panel on the bottom wall of the housing, with the removable panel configured to be removed to expose an opening sized and configured to receive a power conditioner with the power conditioner held at the bottom wall of the housing.

In some embodiments, the system is in combination with a power conditioner comprising a housing having a front surface. A major portion of the power conditioner housing may be received through the opening and the power conditioner may be held in the housing with the front surface of the power conditioner housing adjacent the bottom wall of the enclosure assembly housing. The power conditioner housing may include a bottom surface, a top surface and a front surface. The system may include a first bracket attached to the bottom surface of the power conditioner housing and a second bracket attached to the top surface of the power conditioner housing, and the first bracket may be connectable to one of the back and bottom walls of the enclosure assembly housing and the second bracket may be connectable to the other one of the back and bottom walls of the enclosure assembly housing.

In some embodiments, the system includes a support plate having first and second opposite surfaces. The support plate may be configured to be selectively coupled to the door frame in: (i) a first position with the support plate first surface facing the front panel and the support plate spaced apart from the front panel a first distance; and (ii) a second position with the support plate second surface facing the front panel and the support plate spaced apart from the front panel a second distance that is less than the first distance.

The base of the door assembly may include a frame having a top panel, a bottom panel and first and second opposite side panels. The door of the door assembly may include a frame having a top panel, a bottom panel and first and second opposite side panels. The first side panel of the door frame may be pivotably coupled to the first side panel of the base frame. The door may be pivotable relative to the base between a closed position wherein the second side panel of the door frame is adjacent the second side panel of the base frame and an open position wherein the second side panel of the door frame is pivoted away from the second side panel of the base frame. In the closed position, a gap may be defined between the top panels of the base and door frames and/or between the bottom panels of the base and door frames. In the closed position, the base and door frames may stand off the wall such that the support plate is spaced apart from a plane defined by the wall when the support plate is in the first or the second position.

In some embodiments, the system includes at least one shelf releasably connected to the back wall of the housing and/or the support plate, with the at least one shelf including a primary shelf surface that extends away from and is substantially orthogonal to the back wall of the housing and/or the support plate. The at least one shelf may include at least one support arm having a hinge portion at a front portion of the primary shelf surface and releasably connected to the primary shelf surface by at least one release member, with the at least one release member configured to be removed such that the support arm can be rotated upwardly about the hinge portion to an upright position with the support arm substantially perpendicular to the primary shelf surface.

Some other embodiments of the invention are directed to a structured media enclosure assembly. The assembly includes a housing including a back wall, a bottom wall, a top wall, and first and second sidewalls defining a cavity. The housing is sized and configured to be recessed in a wall and mounted to adjacent studs. At least one hinge clip is on each of the first and second sidewalls. A support plate is releasably held in the housing. The support plate may include a plurality of mounting features for mounting electronic components to the support plate. The support plate includes a primary plate portion having first and second opposite sides. The support plate includes at least one tab at each of opposing edges of the primary plate portion, with each tab extending away from the primary plate portion at an angle, and with the tabs releasably held by the hinge clips. The hinge clips and/or the support plate are configured such that the support plate can be selectively positioned in the housing cavity: in a first position with the first side of the primary plate portion facing the back wall of the housing and the primary plate portion spaced apart from the back wall a first distance; and in a second position with the second side of the primary plate portion facing the back wall of the housing and the primary plate portion spaced apart from the back wall a second distance that is less than the first distance.

Figure 1:
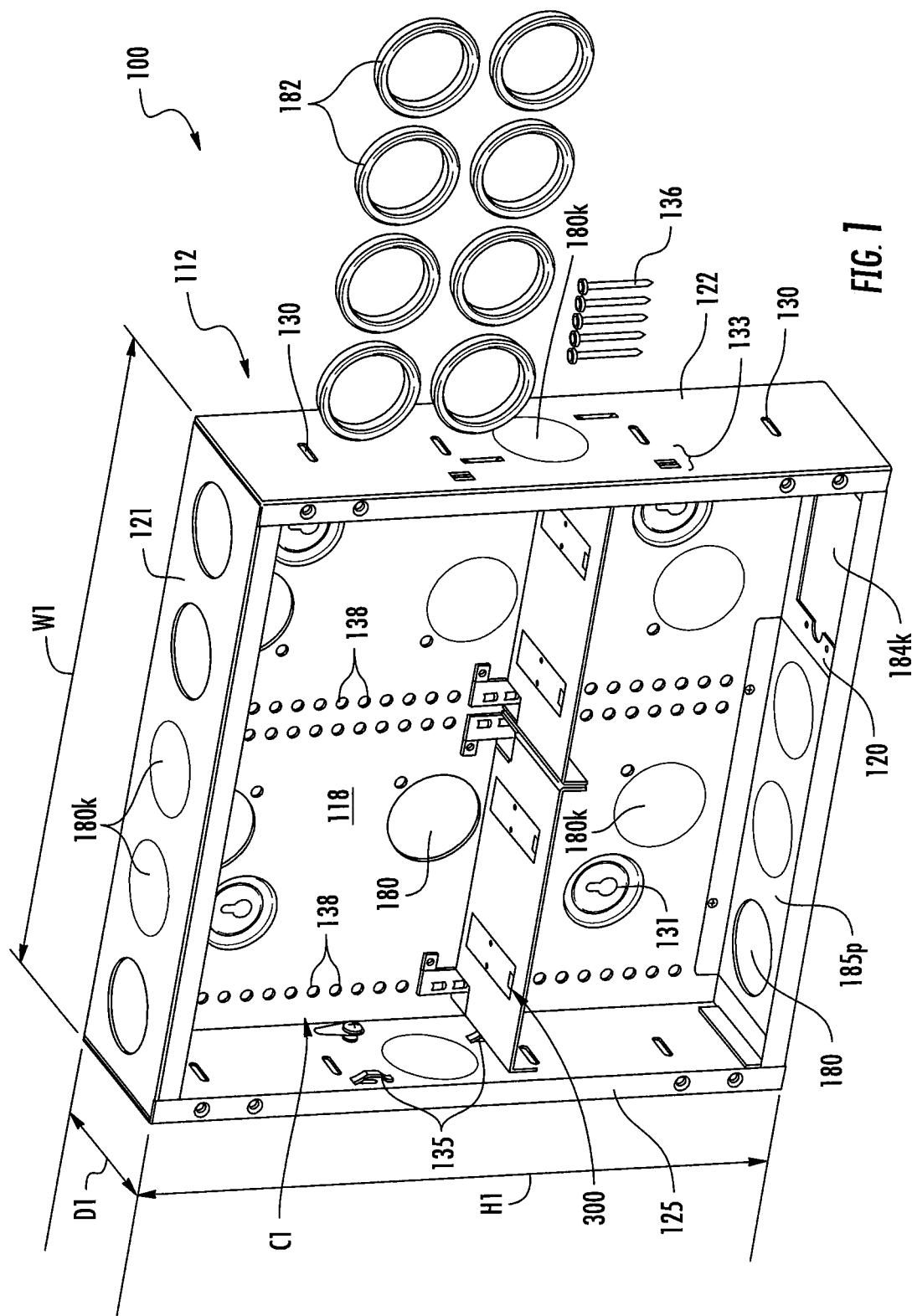
FIG. 1 is a partially exploded perspective view of a media enclosure assembly including a housing according to some embodiments.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

A media enclosure assembly 100 according to some embodiments is illustrated in FIG. 1. The assembly 100 includes a housing 112.

The housing 112 includes a back or rear wall 118, a bottom wall 120 and an opposing top wall 121, and opposing sidewalls 122. The walls 118, 120, 121, 122 define a cavity C1.

Figure 2:
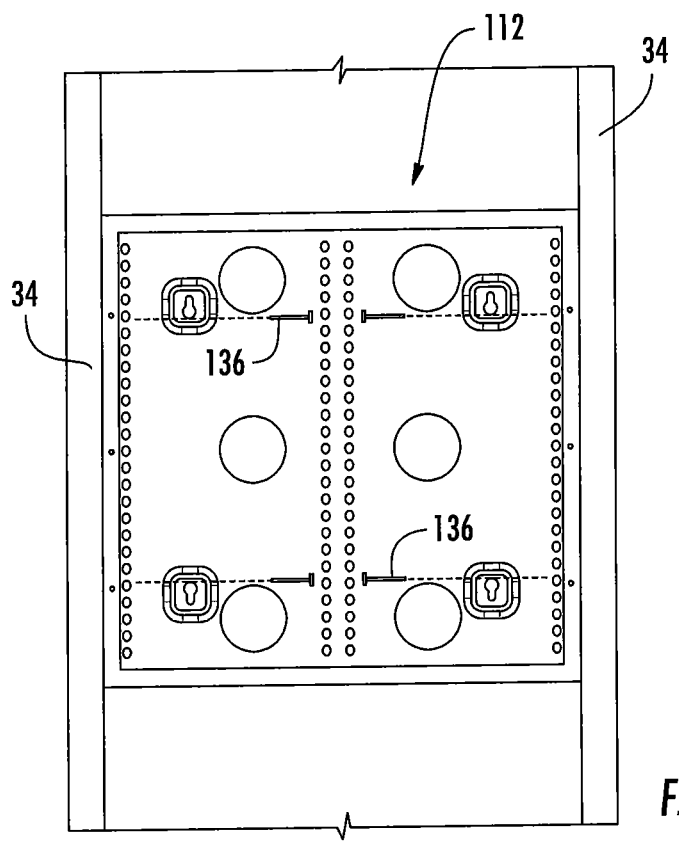
FIG. 2 is a front view of the housing of FIG. 1 being mounted to frame members.

A plurality of apertures 130 are defined in each of the sidewalls 122. As illustrated in FIG. 2, fasteners 136 can be received in at least some of the apertures 130 to mount the housing 112 to frame members or studs 34. For "new work" applications, indicia 133 in the form of a plurality of parallel lines may be included on each of the sidewalls. The indicia 133 allows an installer to position a front surface 125 of the housing 112 forward of the studs 34 to account for the thickness of the drywall that is yet to be hung. For example, the indicia 133 could include lines at ½ inch, ⅝ inch and ¾ inch behind the housing front surface 125. The installer may align the appropriate line with the front of the studs 34 and then mount the housing 112 to the studs 34 using the fasteners 136.

The housing 112 may also be installed in "old work" applications. For example, an installer can mark the drywall using a template or by outlining the housing 112. An opening can be formed using the mark and the housing 112 may be inserted into the opening and mounted to studs using fasteners through the apertures 130.

The housing 112 may have a size (width) to fit between and mount to adjacent studs that are spaced apart 16 inches on center. That is, the housing 112 may be sized to be mounted between adjacent studs with one of the sidewalls 122 connected to one stud and the other one of the sidewalls 122 connected to an adjacent stud.

Figure 3:
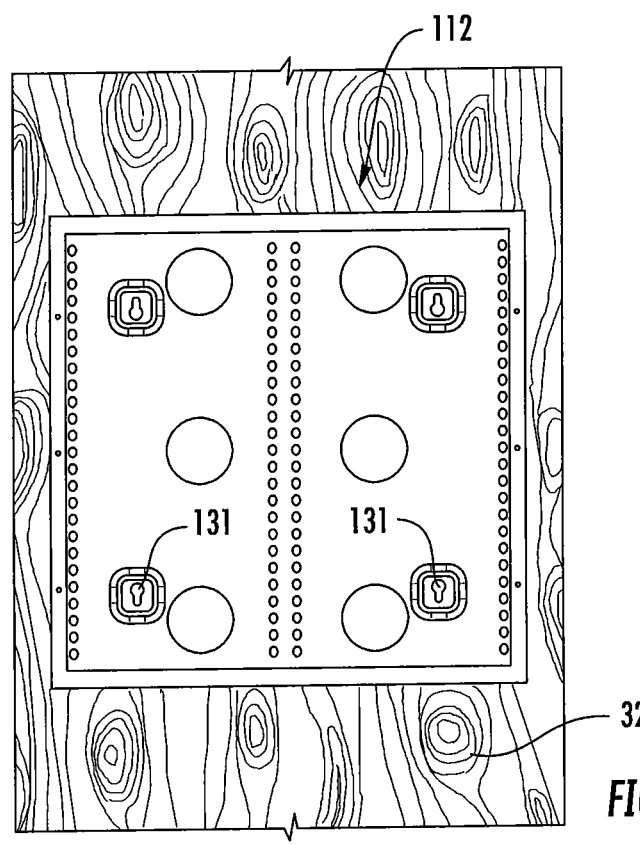
FIG. 3 is a front view of the housing of FIG. 1 being mounted to a mounting surface.

A plurality of apertures 131 may be defined in the back wall 118 of the housing 112. The apertures 131 may be used for surface mounting applications. Referring to FIG. 3, fasteners (e.g., the fasteners 136) may be received through the apertures 131 to mount the housing 112 to a mounting surface 32 which may be a plywood backboard, for example.

A plurality of apertures 138 are also defined in the housing back wall 118. The apertures 138 may be used to mount devices or equipment to the back wall 118 of the housing 112. The apertures 138 may also be used to mount one or more shelves to the housing back wall 118 as will be described in greater detail below.

Cable entry port knockouts 180k may be provided at various locations of the housing 112. As illustrated in FIG. 1, the back wall 118 includes a plurality of knockouts 180k, the bottom wall 120 includes a plurality of knockouts 180k (which may be included on a removable panel), the top wall 121 includes a plurality of knockouts 180k and each sidewall 122 includes at least one knockout 180k. The knockouts 180k may be removed to expose a cable entry opening or port 180 for installing low voltage rings or for cable or wire management. A grommet 182 may be installed at each cable entry port 180. The grommet 182 may be removably attached to the cable entry port 180. The grommet 182 may be formed of a flexible, resilient material that allows the grommet 182 to be cut, pierced, slit and the like.

A knockout 184k may be provided on the housing bottom wall 120. The knockout 184k is configured to be knocked out or removed to expose an opening 184 (FIG. 7) for installing components such as a low voltage ring or an outlet box.

The housing 112 also includes a removable panel 185p that is removably attached or fastened to the back wall 118 and/or the bottom wall 120 of the housing 112.

The panel 185p may be releasably fastened to the housing 112 at the bottom wall 120 and/or the back wall 118. The panel 185p can be removed and an electronic device such as a power conditioner can be dropped in and mounted to the housing 112.

Figure 4:
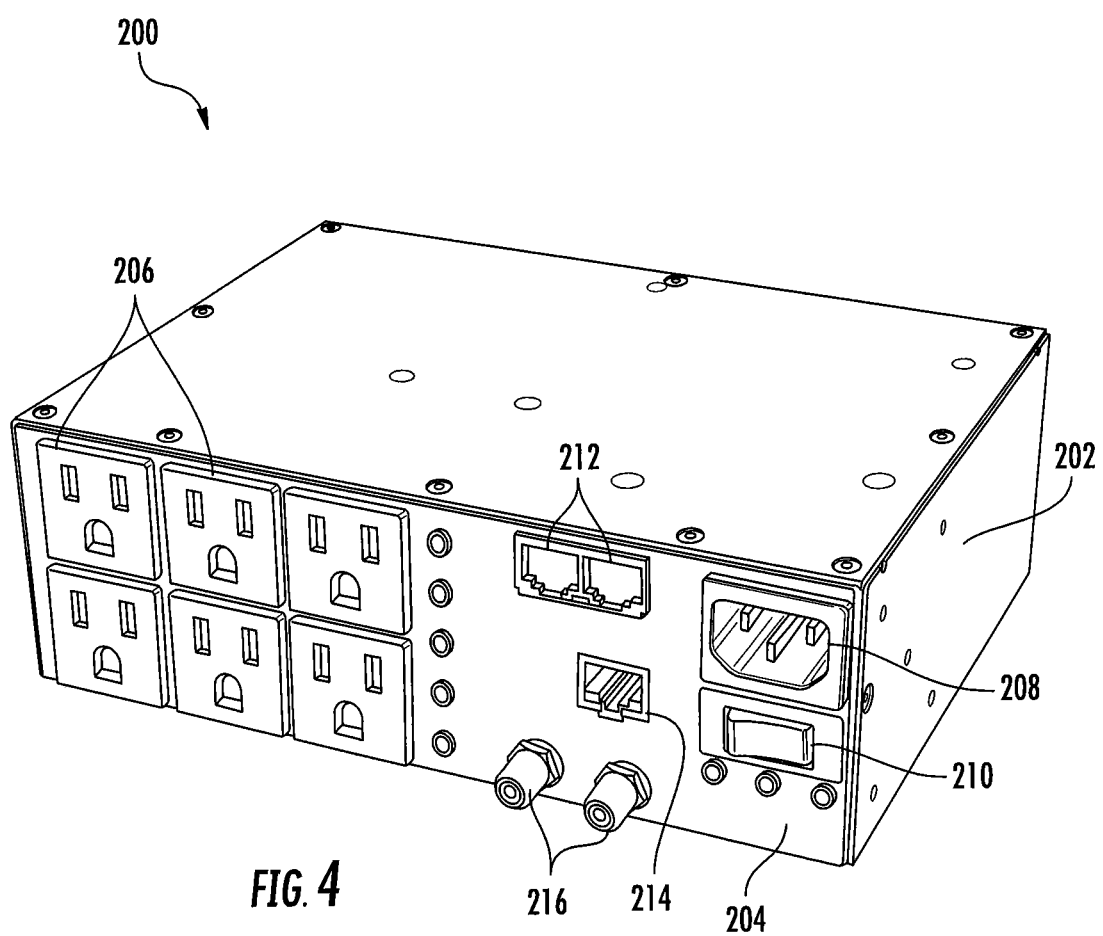
FIG. 4 is a perspective view of a power conditioner that can be mounted in the housing of FIG. 1.

A power product 200 such as a power conditioner suitable for mounting in the housing 112 is illustrated in FIG. 4. The power conditioner 200 includes a housing 202. A plurality of outlets 206 are on a front surface 204 of the housing 202. Also on the housing front surface 204 is a power cable port 208 for connecting the power conditioner 200 to a power source. Various other features may be included on the housing front surface 204 including a power switch 210, protected pass-though ports 212 for Ethernet or telephone cable (e.g., RJ45 cable), a network connection port 214 and/or pass-through ports 216 for cable or satellite cable (e.g., coaxial cable). The power conditioner 200 may include additional components or features as understood by those skilled in the art.

Figure 5:
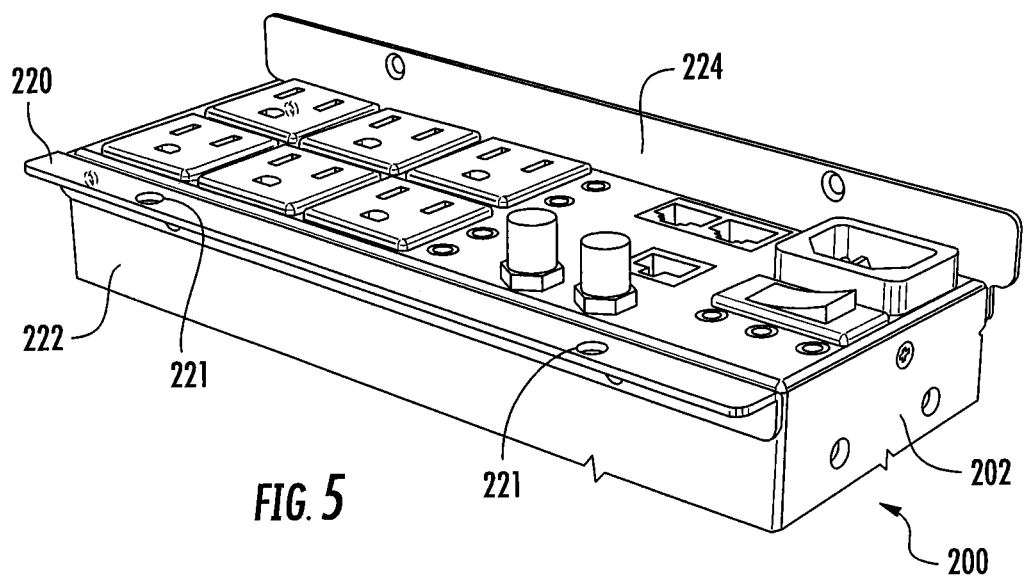
FIGS. 5 and 6 are perspective views of the power conditioner of FIG. 4 with brackets mounted thereto.
Figure 6:
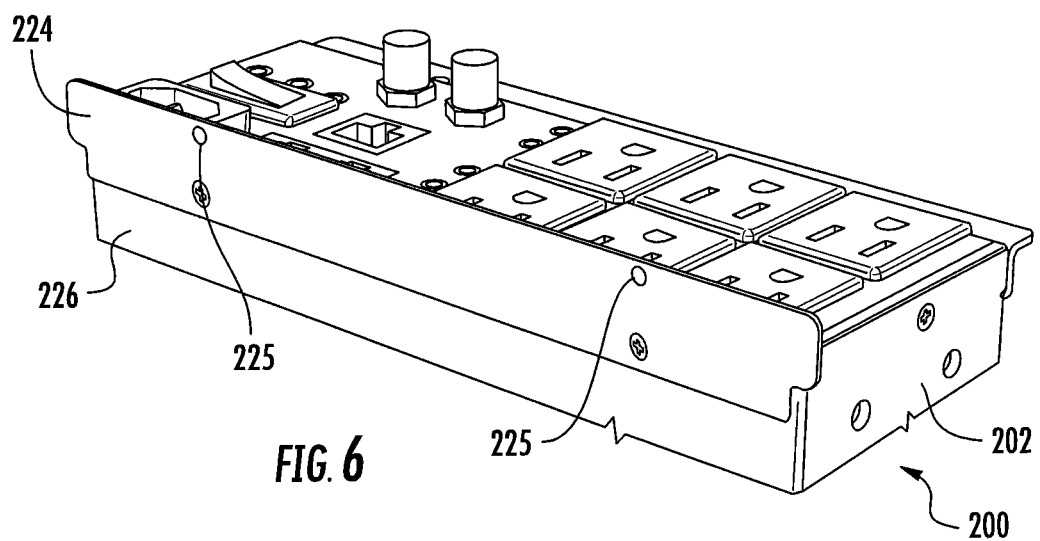

As illustrated in FIG. 5, a first bracket 220 (e.g., an angled or L-shaped bracket) may be fastened to a bottom surface 222 of the power conditioner housing 202. As illustrated in FIG. 6, a second bracket 224 (e.g., a flat bracket) may be fastened to a top surface 226 of the power conditioner housing 202. In some embodiments, the first bracket 220 and/or the second bracket 224 may be integrally formed with the power conditioner housing 202.

Figure 7:
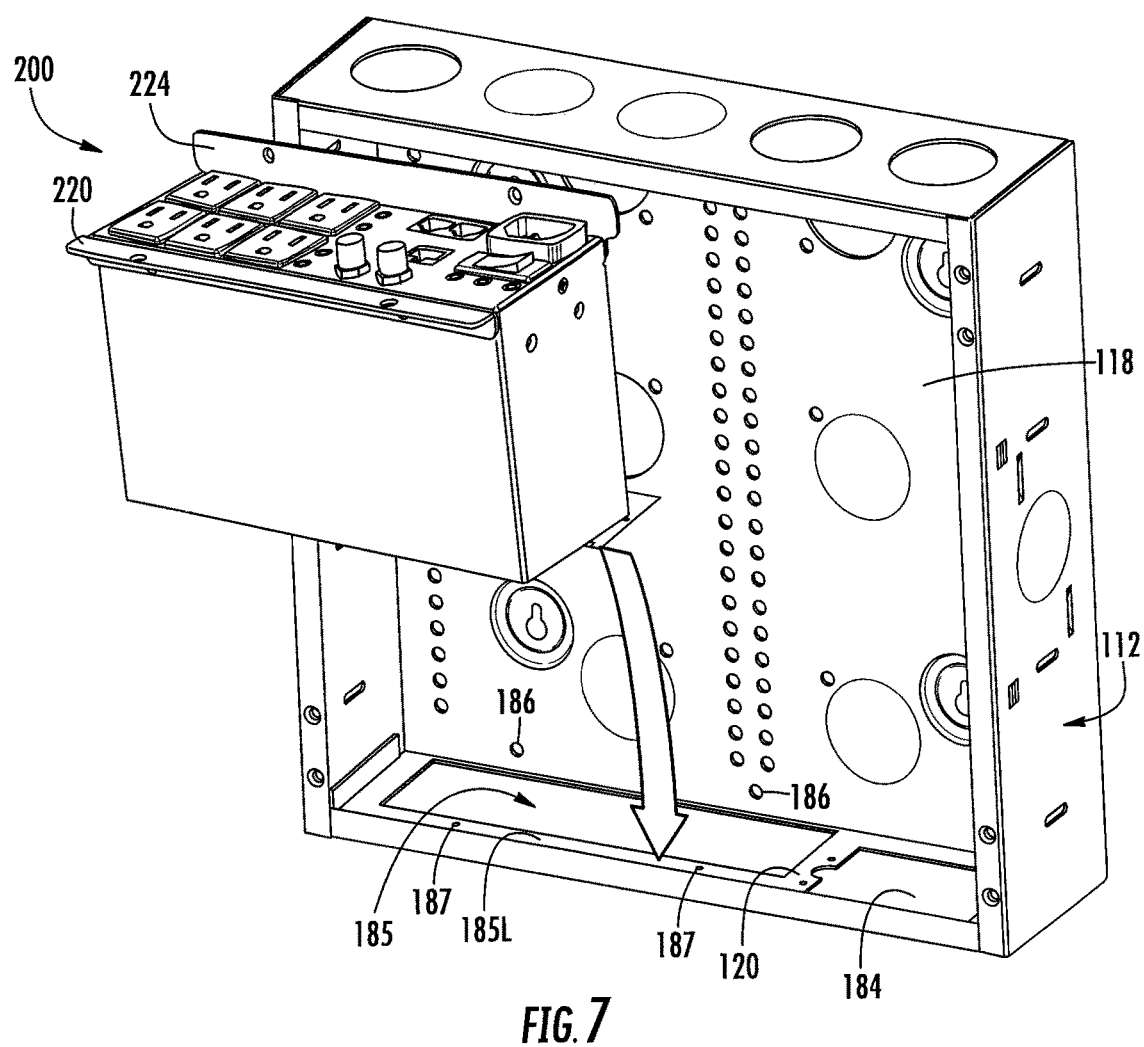
FIG. 7 is a perspective view of the power conditioner of FIG. 4 being dropped in the housing of FIG. 1.

Referring to FIG. 7, an opening 185 is defined in the bottom wall 120 of the housing 112 when the panel 185p (FIG. 1) is removed. The opening may be defined in part by a ledge 185L of the bottom wall 120. The power conditioner 200 with the brackets 220, 224 is shaped, sized and configured to be securely mounted to the housing 112. Specifically, as shown in FIGS. 7 and 8, the power conditioner 200 may be dropped in the housing 112 such that a major portion of the power conditioner housing 202 is received through the opening 185 while the brackets 220, 224 engage the housing 112 to hold the power conditioner 200 in place.

Figure 8:
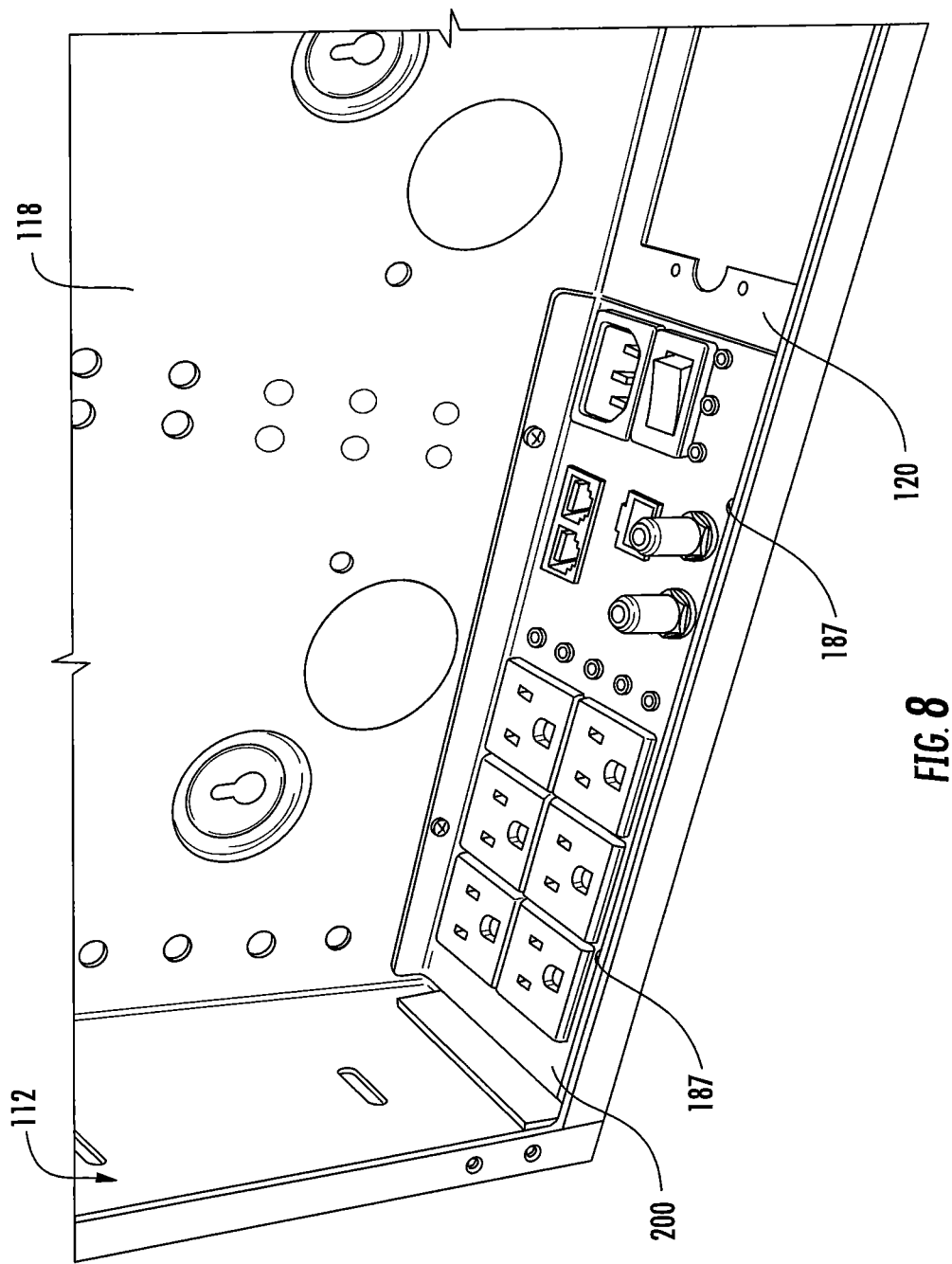
FIG. 8 is a fragmentary perspective view of the power conditioner of FIG. 4 held in the housing of FIG. 1.

The second bracket 224 may include one or more apertures 225 (FIG. 6) for fastening the second bracket 224 to the back wall 118 of the housing 112 (FIG. 8). The apertures 225 may be aligned with apertures 186 formed in the housing back wall 118 (FIG. 7), and fasteners may be received through the aligned apertures. The first bracket 220 may include one or more apertures 221 (FIG. 5) for fastening the first bracket 220 to the bottom wall 120 of the housing 112 (FIG. 8). The apertures 221 may be aligned with apertures 187 formed in the housing bottom wall 120 and/or the ledge 185L (FIGS. 7 and 8), and fasteners may be received through the aligned apertures. These features may be used to further secure the power conditioner 200 to the housing 112.

In some embodiments, the enclosure assembly 100 includes the power conditioner 200.

Referring back to FIG. 1, a plurality of hooks or loops 135 may be on each housing sidewall 122. The loops 135 are configured to receive zip ties or the like to manage cables or wires such that they run down the sidewall 122 of the housing 112 and stay out of the way of equipment held or mounted in the housing 112.

Figure 9:
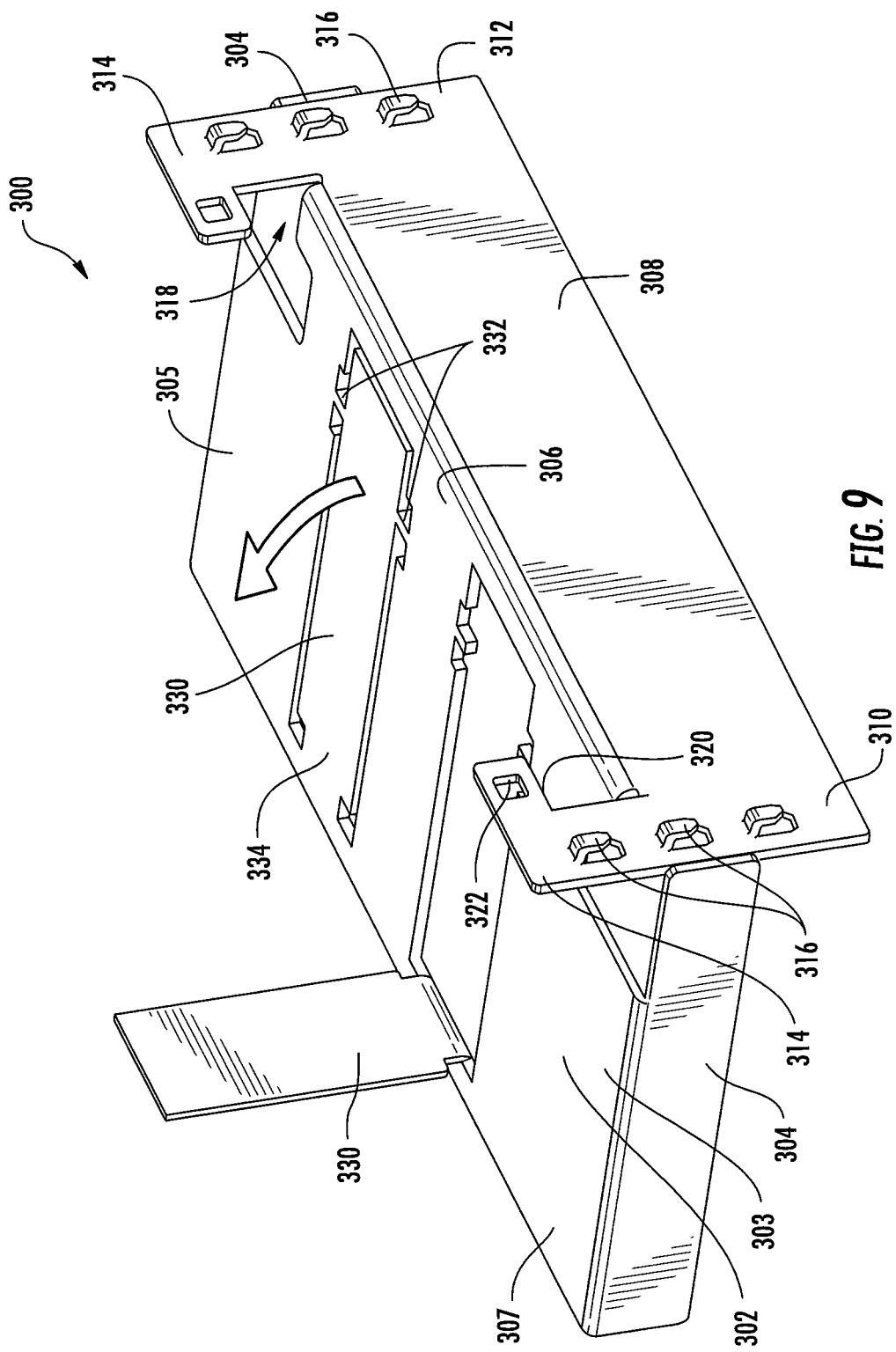
FIG. 9 is a perspective view of a shelf that can be mounted in the housing of FIG. 1.

A plurality of shelves 300 are shown mounted in the housing 112 using the mounting apertures 138. One of the shelves 300 is illustrated in FIG. 9.

The shelf 300 has a primary shelf surface 302. A first side wall member 304 extends downwardly from a first side 303 of the shelf surface 302 and a second, opposite side wall member 304 extends downwardly from a second, opposite side 305 of the shelf surface 302. A rear wall member 308 extends downwardly from a rear 306 of the shelf surface 302.

The rear wall 308 includes first and second opposite side portions 310, 312. Each of the side portions 310, 312 includes a tab 314 that extends upwardly above the shelf surface 302 between the rear 306 of the shelf surface 302 and one of the side walls 304. A plurality of hooks 316 extend outwardly and downwardly from each rear wall side portion 310, 312. At least some of the hooks 316 may be on each of the tabs 314.

One or more openings 318 may be defined in the primary shelf surface 302, for example at one or both rear corners thereof. As illustrated in FIG. 9, one opening 318 is defined between the shelf surface 302, the rear wall first side portion 310 and one of the side walls 304, and another opening 318 is defined between the shelf surface 302, the rear wall second side portion 312 and the other one of the side walls 304.

A ledge 320 extends inwardly from each one of the tab members 314 toward the other tab member 314. An aperture 322 is defined in each one of the ledges 320.

The primary shelf surface 302 may include at least one support arm or bar 330. Two support arms 330 are illustrated in FIG. 9 (although it is contemplated that the primary shelf surface 302 may include one support arm 330 or more than two support arms 330). The support arm or bar 330 may be attached or connected to the primary shelf surface 302 by at least one release member 332 (e.g., two release members 332 with one each on opposite sides of the support arm 330). The support arm 330 may also be attached or connected to the shelf surface by a hinge portion 334 that is located adjacent the front portion 307 of the shelf surface 302.

The release members 332 may be cut or otherwise broken and the support arm 330 may be rotated upwardly about the hinge portion 334 in the direction indicated by the arrow. The support arm 330 may be rotated to an upright position (e.g., generally vertical or generally orthogonal to the primary shelf surface 302) as illustrated in FIG. 9.

The shelf 300 including the support arms 330 may be formed of any suitable material. For example, the shelf 300 including the support arms 330 may be formed of metal such as steel. In this sense, the material at the hinge portion 334 may have sufficient strength to maintain the support arm 330 in the upright position.

Referring to FIGS. 1 and 9, the shelf 300 may be mounted to the housing 112 by receiving the hooks 316 in the apertures 138 formed in the back wall 118. The shelf 300 can provide stability and flexibility for equipment installation. Equipment such as a security battery, router or modem can be held on the shelf primary surface 302. Cables and wires associated with the equipment may be received through the openings 318 to facilitate wire management. The ledges 320 and associated apertures 322 can be used to receive zip ties or the like that may further help with cable or wire management (e.g., the cable or zip tie may be routed through the aperture 322 and used to bundle cable or wire extending through the opening 318).

The support arms 330 may be moved to the upright position to hold equipment in place. Specifically, the equipment may be held between the upright support bar(s) 330 and the back wall 118 of the housing 112.

The housing 112 may be formed of any suitable material. For example, the housing 112 may be formed of metal such as steel. In some embodiments, the enclosure assembly 100 is UL certified. In some embodiments, the enclosure assembly 100 is UL 1863 certified.

Referring to FIG. 1, the housing 112 has a height H1, a width W1 and a depth D1. The height H1 may be between about 13 and 15 inches and, in some embodiments, is about 14 inches. The width W1 may be between about 14 and 15 inches and, in some embodiments, is about 14.25 inches. The depth 17 may be between about 3 and 5 inches and, in some embodiments, is about 3.9 inches.

Figure 10:
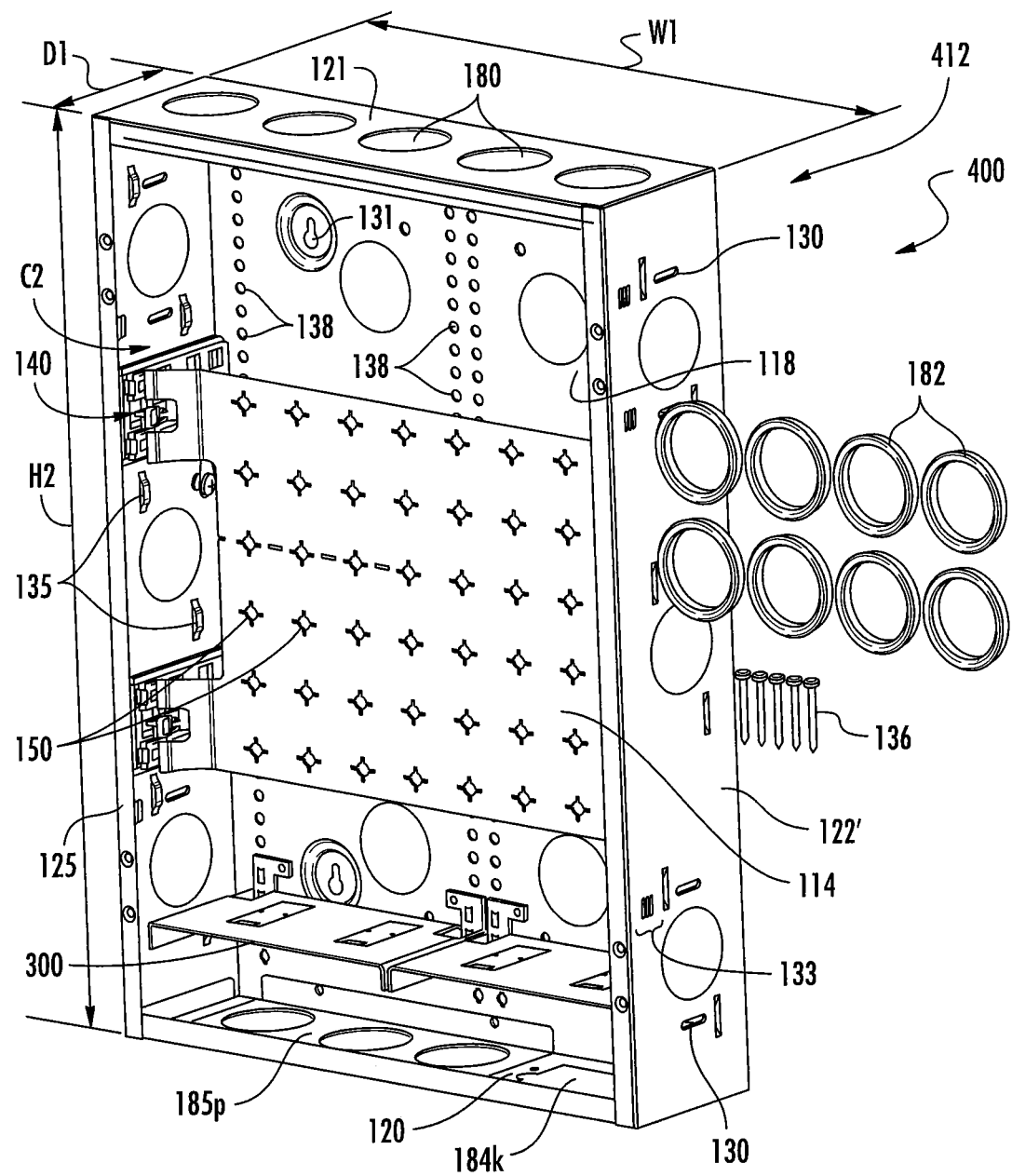
FIG. 10 is a partially exploded perspective view of a media enclosure assembly including a housing and a support plate according to some other embodiments.

An media enclosure assembly 400 according to some embodiments is illustrated in FIG. 10. The assembly 400 includes many components that are the same or substantially the same as the components of the enclosure assembly 100. Components that are the same or substantially the same share the same reference number and have been described in detail above.

The assembly 400 includes a housing 412. The housing 412 includes a back wall 112, a bottom wall 120 and an opposite top wall 121, and opposite sidewalls 122'. The walls 112, 120, 121, 122' define a cavity C2.

The sidewalls 122' of the housing 412 are taller than the sidewalls 122 of the housing 112 and, as a result, the housing 412 has a height H2 that is greater than the height H1 of the housing 112. The height H2 may be between about 19 and 21 inches and, in some embodiments, the height H2 is about 20 inches.

Two hinge clips 140 may be releasably attached to each housing sidewall 122' and a support plate 114 may be releasably and pivotably attached to the hinge clips 140.

Figure 11:
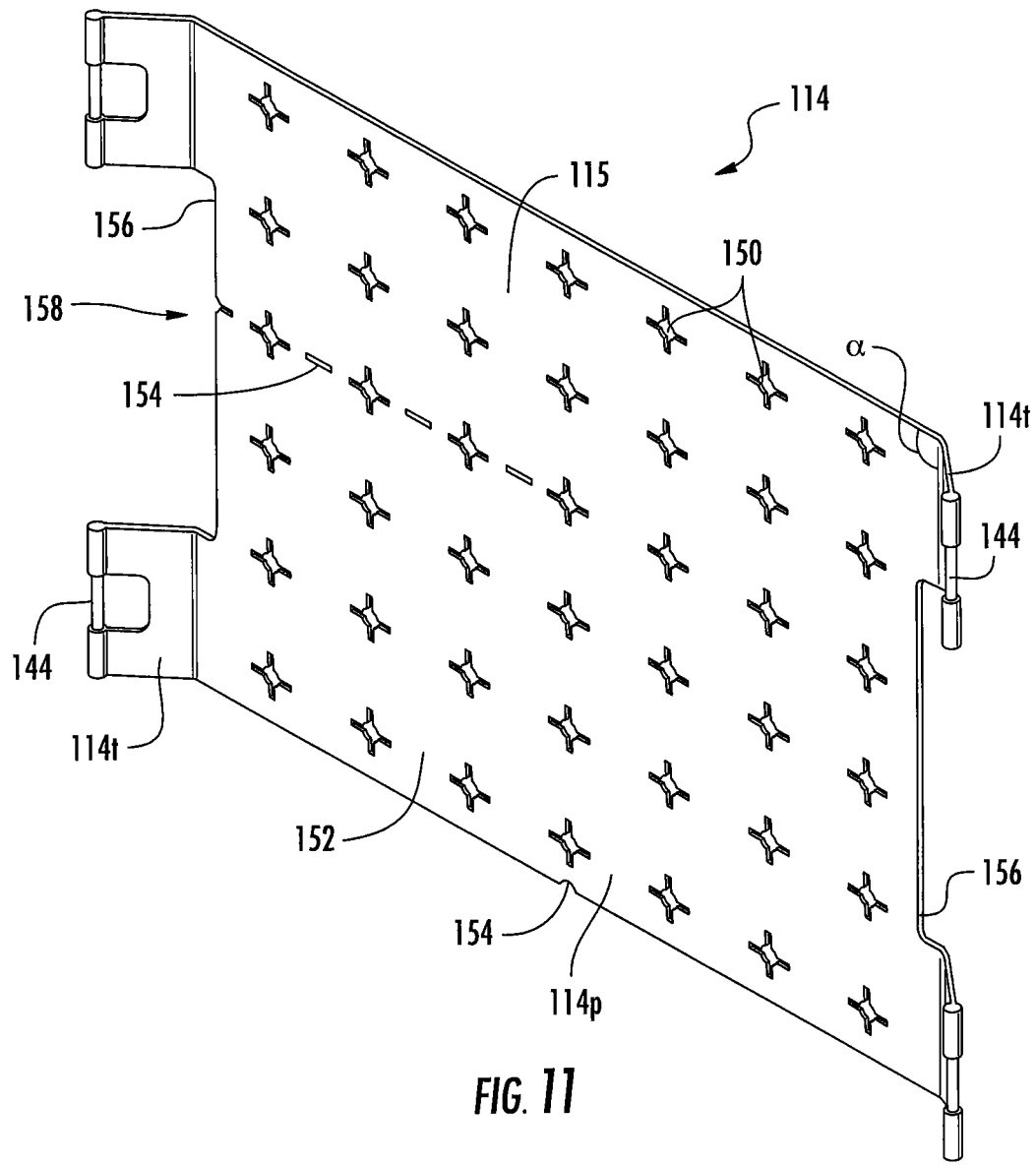
FIG. 11 is a perspective view of the support plate of FIG. 10.

FIG. 11 illustrates the support plate 114. The support plate 114 includes a plurality of apertures or perforations 150 extending therethrough. The apertures 150 are for mounting items such as electronic equipment and/or for cable or wire management. In some embodiments, and as illustrated, the apertures 150 may include a center opening and a plurality of elongated slots extending away from the center opening. Clips, hooks, hook and loop fasteners, straps and other mounting features known to those of skill in the art may also be employed in addition to or instead of the apertures 150.

The support plate 114 may include a removable section 152. Score lines 154 extend to or near adjacent transverse edges of the support plate 114 to facilitate removal of the removable section 152. The removable section 152 may be removed using a tool (e.g., tin snips) and/or by bending (e.g., fatiguing) the support plate 114 at the score lines 154. Removal of the removable section 152 may be desirable when a relatively large (deep) electronic component is mounted to the back wall 118 of the housing 412 (FIG. 10). Additional portions of the support plate 114 may be selectively removed as needed, for example using tin snips.

The support plate 114 includes a primary plate member or portion 114$p$. A pair of tabs or tab members or portions 114$t$ extends away from each one of opposing edge portions 156 of the primary plate member 114$p$. Each of the tabs 114$t$ is angled relative to the primary plate portion 114$p$. Specifically, each tab member 114$t$ extends away from the primary plate portion 114$p$ such that an angle α is defined between the primary plate member 114$p$ (or a first side or surface 115 thereof) and the tab 114$t$. In some embodiments, the angle α is an obtuse angle. A pivot bar 144 is at a distal end of each tab member 114$t$.

A recess or valley 158 is defined between the tab members 114$t$ at each opposing edge portion 156 of the plate member 114$p$. The recesses 158 may facilitate cable management. The recesses 158 may also allow a user to grip the support plate to insert, remove and/or pivot the support plate 114 with respect to hinge clips 140 that are described below.

The support plate 114 may be formed of any suitable material. In some embodiments, the support plate 114 is metal such as steel.

Figure 13:
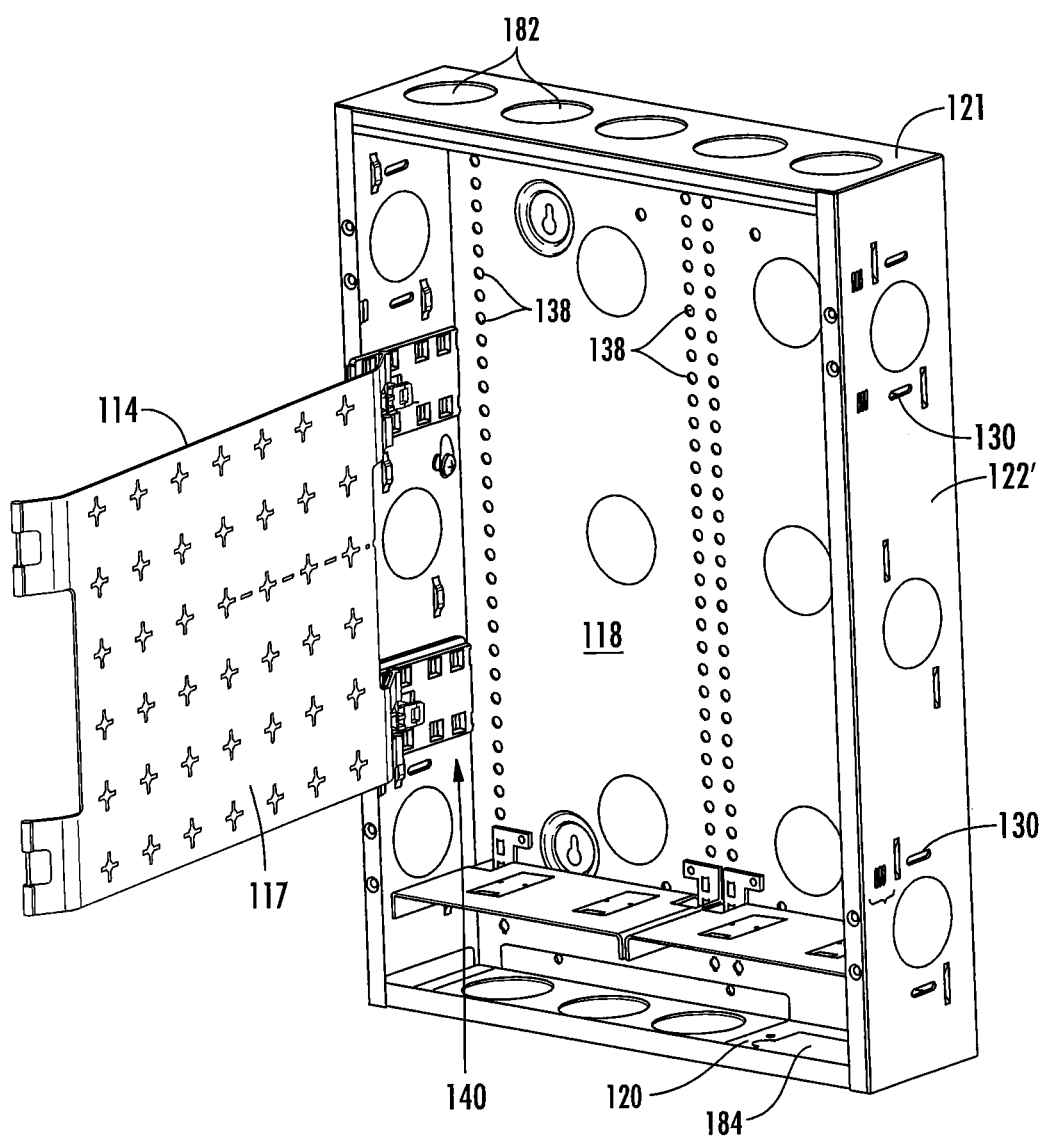
FIG. 13 is a perspective view of the support plate pivotably connected to the housing of FIG. 10.

As illustrated in FIG. 10, two spaced apart hinge brackets or hinge clips 140 are provided on each sidewall 122' of the housing 412 (although it is contemplated that one hinge clip 140 or more than two hinge clips 140 may be provided on each sidewall 122'). As illustrated in FIG. 13, the support plate 114 may be pivotably coupled to the hinge clips 140 such that the support plate 114 may be disengaged from one pair of the hinge clips 140 and pivoted at the other pair of the hinge clips 140.

Figure 12:
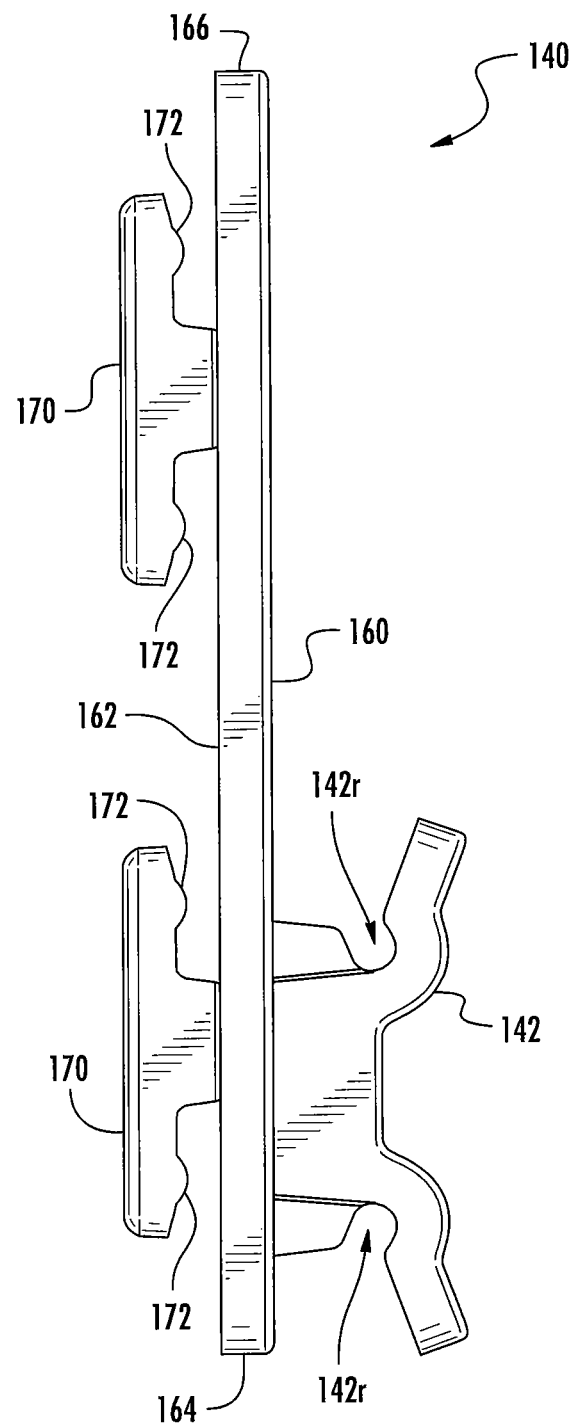
FIG. 12 is a side view of a hinge clip that can be mounted in the housing of FIG. 10.

One of the hinge clips 140 is shown in greater detail in FIG. 12. The hinge clip 140 includes opposing faces 160, 162 and opposite ends 164, 166. A clip member 142 is provided on the face 160 and includes a pair of receiving pockets or portions 142$r$. As will be described in greater detail below, the hinge clips 140 can be reversibly mounted to the housing 412 such that a respective hinge clip 140 can be mounted to the housing in first and second reversed configurations or positions. One of the receiving pockets 142$r$ is configured to receive one of the support plate pivot bars 144 (FIG. 11) when the hinge clip 140 is in the first configuration, and the other one of the receiving pockets 142$r$ is configured to receive the pivot bar 144 when the hinge clip 140 is in the second configuration. The clip member 142 is positioned closer to the end 164 than the end 166 such that the support plate 114 will be spaced apart a different distance from the housing back wall 118 when the hinge clips 140 are in the different configurations.

Referring to FIG. 13, each of a pair of support plate pivot bars 144 may be disengaged with its associated hinge clip member 142 and the support plate may be pivoted about an axis defined by the other pair of the support plate pivot bars 144. In some embodiments, the support plate 114 is pivotable between a first or fixed position with the support plate 114 in the cavity C2 and generally parallel to and spaced apart from the housing back wall 118 (e.g., FIG. 10) and a second or rotated position with the support plate 114 at least partially outside the cavity C2 and generally perpendicular to the housing back wall 118 (e.g., FIG. 13). It will be appreciated that the support plate 114 may be pivoted in an opposite direction to that shown in FIG. 13; that is, the support plate 114 may be pivotably held by the other pair of hinge clips 140 and pivoted about an axis defined by the other pair of support plate pivot bars 144.

Figure 14:
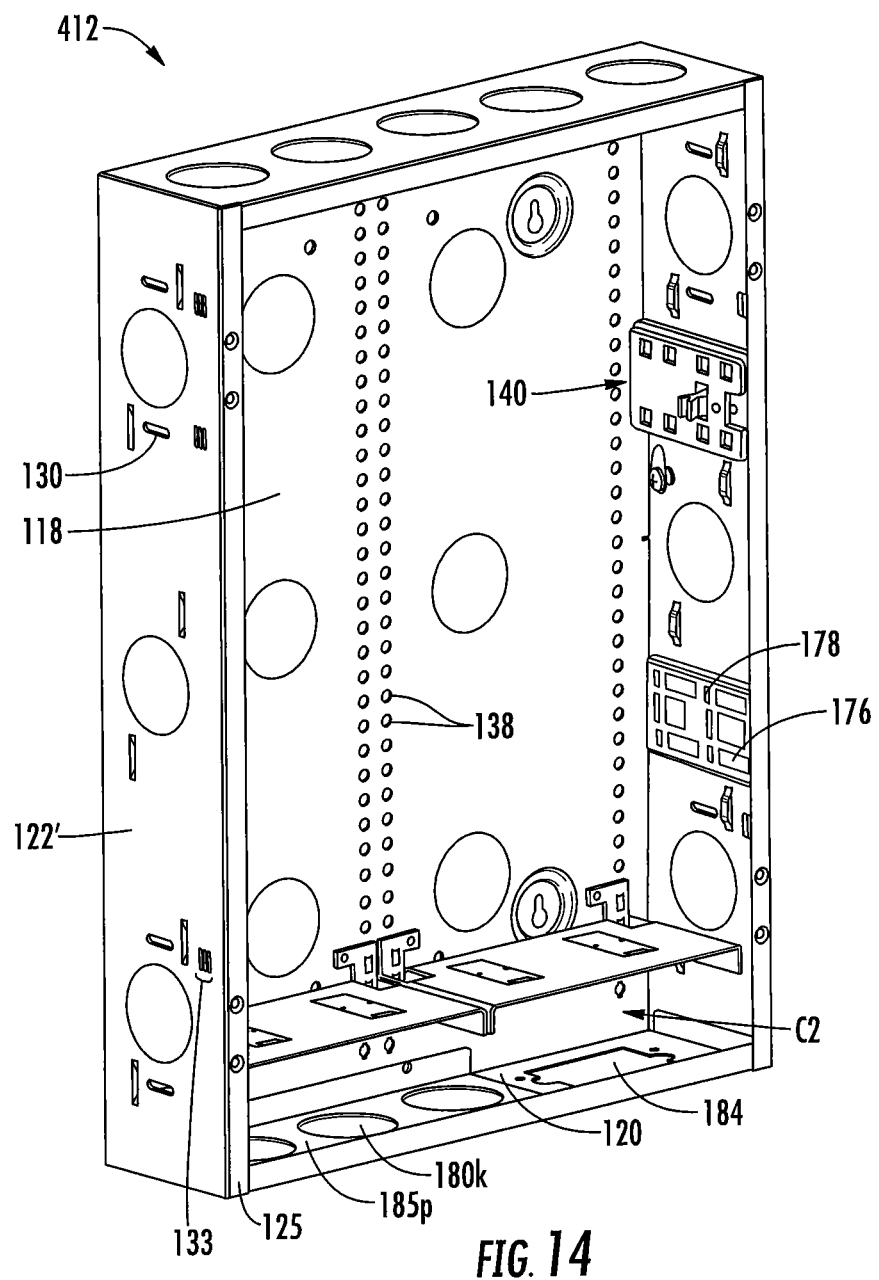
FIG. 14 is a perspective view of the housing of FIG. 10.

Referring to FIG. 12, a plurality of tabs 170 are provided on the opposite face 162 of the hinge clip 140. As illustrated, each tab 170 includes a pair of projections 172. As illustrated in FIG. 14, a plurality of elongated slots 176 and adjacent apertures or openings 178 may be defined in the housing sidewall 122'. The hinge clip 140 may be releasably (and reversibly) mounted to the housing 412 such that each tab 170 is received in one of the slots 176 and one of the projections 172 is received in an adjacent opening 178.

The hinge brackets 140 are configured to hold the support plate 114 spaced apart from the back wall 118 of the housing 412 with a major portion of the support plate 114 (e.g., the primary plate portion 114$p$) generally parallel to the back wall 118. The support plate 114 allows for two layers of components or equipment to be mounted in the housing 412 and/or for sectioning off areas of the housing 412, as described in more detail below.

Figure 15:
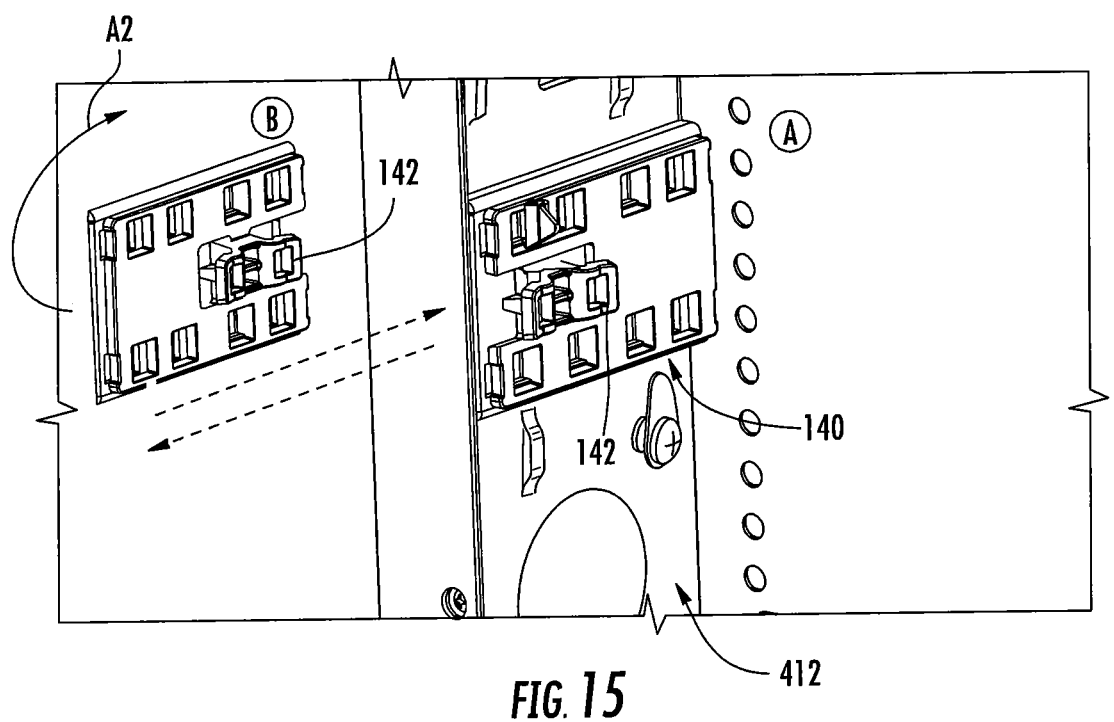
FIG. 15 is a fragmentary perspective view of the housing of FIG. 10 illustrating the hinge clip of FIG. 12 that may be releasably mounted to the housing in first and second configurations according to some embodiments.
Figure 16A:
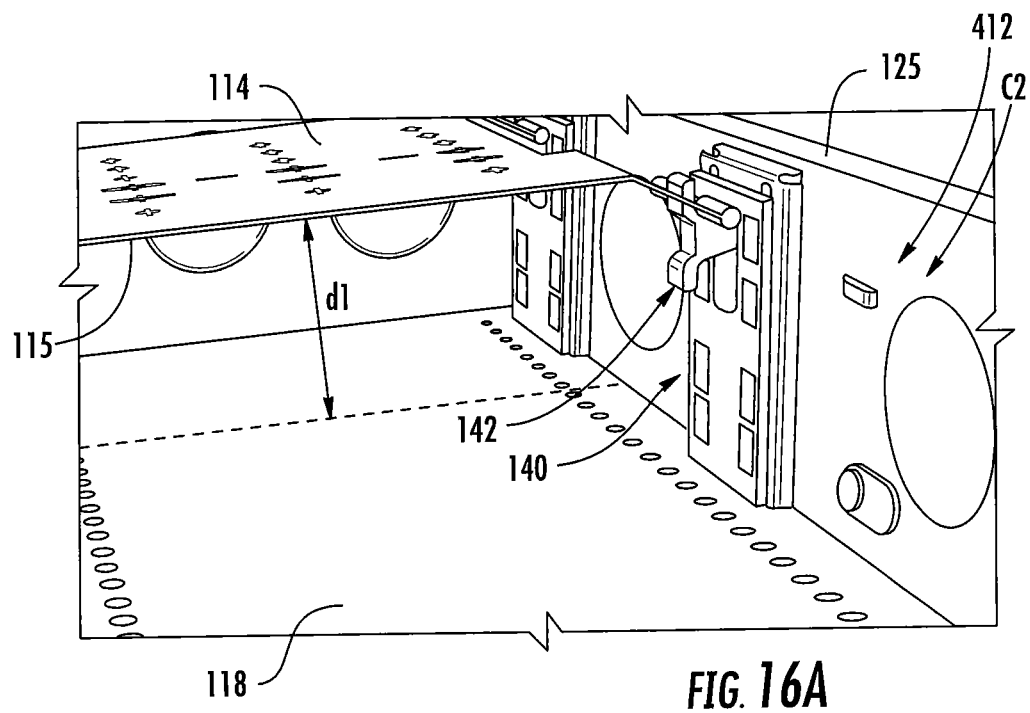
FIGS. 16A-16D illustrate the support plate held in the housing of FIG. 10 in first, second, third and fourth positions, respectively.
Figure 16B:
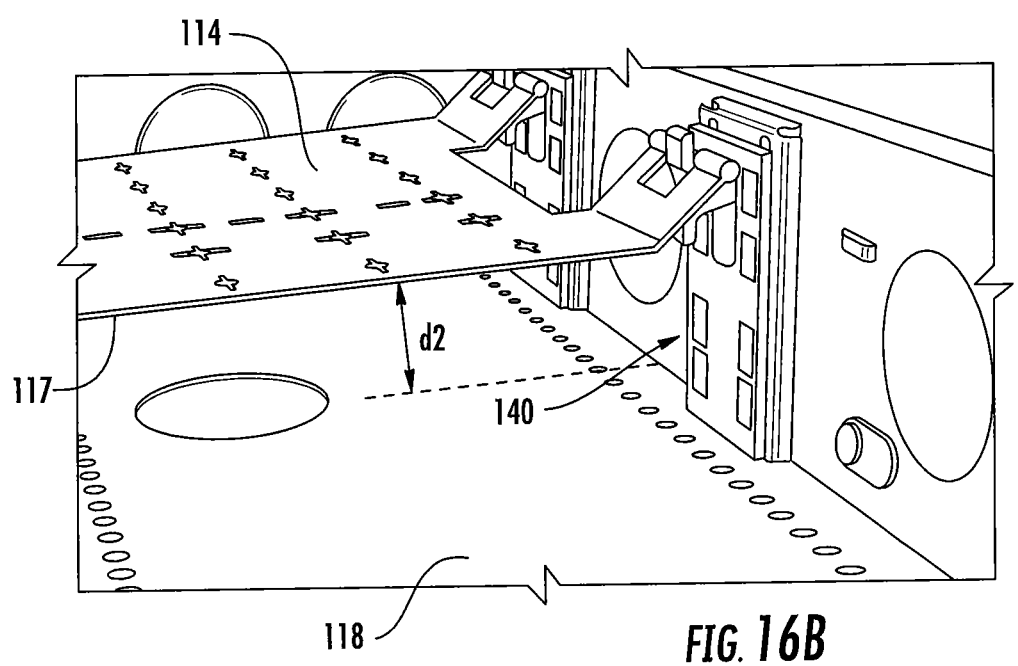
Figure 16C:
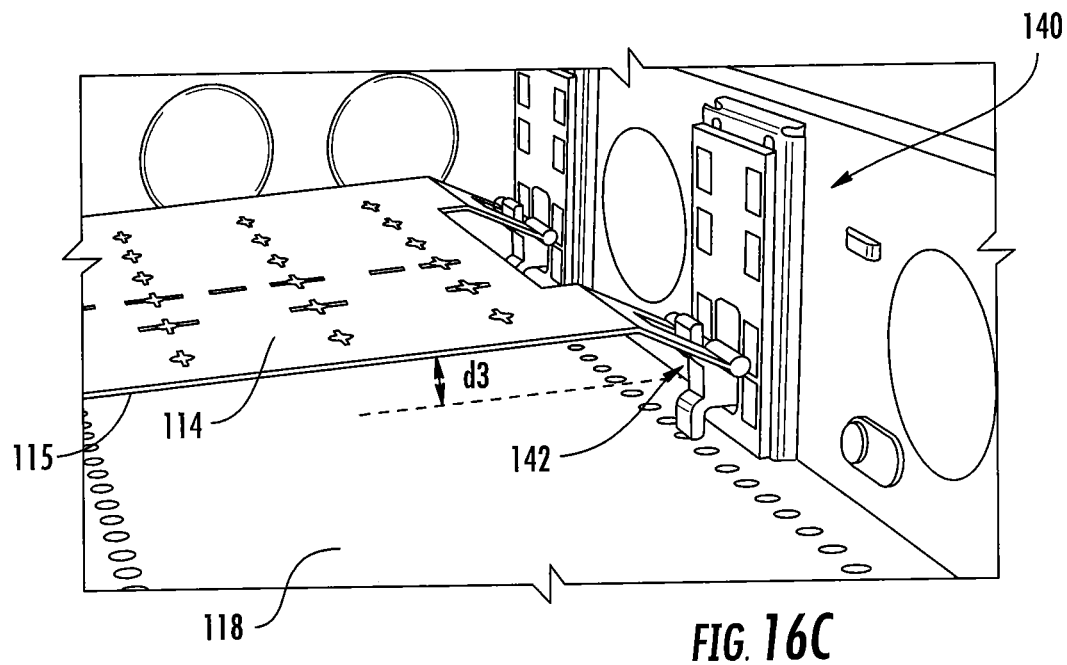
Figure 16D:
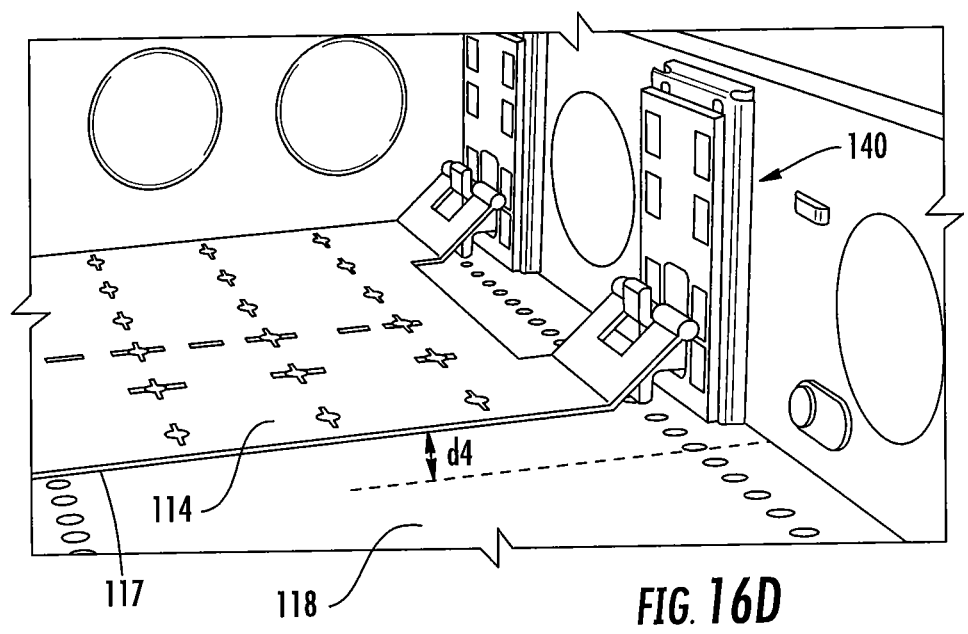

Turning to FIG. 15, each hinge clip 140 may be reversible for additional installation options. Each hinge clip 140 may be releasably mounted to the housing 412 in a first configuration A shown in FIG. 15, removed from the housing 412, rotated 180 degrees as shown by the arrow A2 to a second configuration B, and reinserted or releasably mounted to the housing 412 in the second configuration B. With the hinge clips 140 in the first configuration, the support plate 114 may be held in first and second positions in the housing cavity C2 with the plate member 114$p$ generally parallel to and spaced apart a first distance d1 and a second distance d2, respectively, from the housing back wall 318 (FIGS. 16A and 16B). With the hinge clips 140 in the second configuration, the support plate 114 may be held in third and fourth positions in the housing cavity C2 with the plate member 114$p$ generally parallel to and spaced apart a third distance d3 and a fourth distance d4, respectively, from the housing back wall 318 (FIGS. 16C and 16D). As illustrated, the first distance d1 is greater than the second distance d2 and the third distance d3 is greater than the fourth distance d4.

It will be appreciated that the configuration of the support plate 114 with the angled tabs 114$t$ allows for the support plate 114 to be mounted at additional different depths in the housing cavity C1. The support plate 114 or the primary plate portion 114$p$ has a first side 115 (FIG. 11) and a second, opposite side 117 (FIG. 13). With the hinge clips 140 in the first configuration, the support plate 114 may be held in the first position described above (FIG. 16A) with the support plate first side 115 facing the back wall 118 of the housing 412. This may also be referred to as the "raised front" position. With the hinge clips 140 also in the first configuration, the support plate 114 may be held in the second position described above (FIG. 16B) with the support plate second side 117 facing the back wall 118 of the housing 412. This second position may also be referred to as the "recessed front" position.

With the hinge clips 140 in the second or "reversed" configuration, the support plate 114 may be held in the third position described above (FIG. 16C) with the support plate first side 115 facing the back wall 118 of the housing 412. This may also be referred to as the "raised rear" position. With the hinge clips 140 also in the second configuration, the support plate 114 may be held in the fourth position described above (FIG. 16D) with the support plate second side 117 facing the back wall 118 of the housing 412. This fourth position may also be referred to as the "recessed rear" position.

As noted above, the support plate 114 allows for two layers of components to be mounted in the housing 412. It will be appreciated that the rear wall 118 of the housing 412 and the support plate 114 effectively provide two relatively large mounting surfaces for mounting components within the housing and/or for enhanced cable management. It will also be appreciated that the pivotable support plate 114 allows for access of components mounted on the "rear layer" or the back wall 118 of the housing 412.

A wide variety of components and equipment may be installed or mounted to the support plate 114 and/or the housing back wall 118. These include audio components such as amplifiers, wireless speaker transmitters and distributed audio components (Sonos, etc.) as well as video components such as distributed video components (HDMI extenders, etc.), cable boxes (e.g., DirecTV client box) and Smart TV boxes (Apple TV, Roku, etc.). Power products such as outlets, surge protectors and power conditioners and network components such as wireless access points, switches and routers may also be installed. Other equipment that may be installed includes control systems or processors (e.g., Pro Control), surveillance components (e.g., analog to digital converters) and cable management equipment.

The removable section 152 of the support plate 114 and/or the reversible hinge clips 140 provide further installation flexibility. As noted above, the removable section 152 may be removed to accommodate larger (e.g., deeper) components such as a network music player. Further, the hinge clips 140 may be reversed to provide different layer depths for additional flexibility. For example, the support plate 114 may be held in the second, third or fourth positions shown in FIGS. 16A-16D to allow for larger components to be mounted to the "front layer" or on the support plate 114 (e.g., to make such components more accessible and/or for improved ventilation). Again, the configuration of the support plate 114 with the angled tabs 114$t$ allow the support plate 114 to be held at four different depths in the housing 412, providing even further installation flexibility.

In some embodiments, in the first configuration shown in FIG. 16A, the support plate 114 is spaced apart from the housing back wall 118 the first, maximum distance d1 and the support plate 114 is flush with the front surface of the housing 412. That is, the support plate 114 may be coplanar or substantially coplanar with the housing front surface 125 (FIG. 10) in this position.

As described above, the panel 185$p$ may be removed from the housing 412 such that the power conditioner 200 and associated brackets 220, 224 (FIG. 7) may be dropped in and/or mounted to the housing 412. In some embodiments, the enclosure assembly 400 includes the power conditioner 200.

Figure 17:
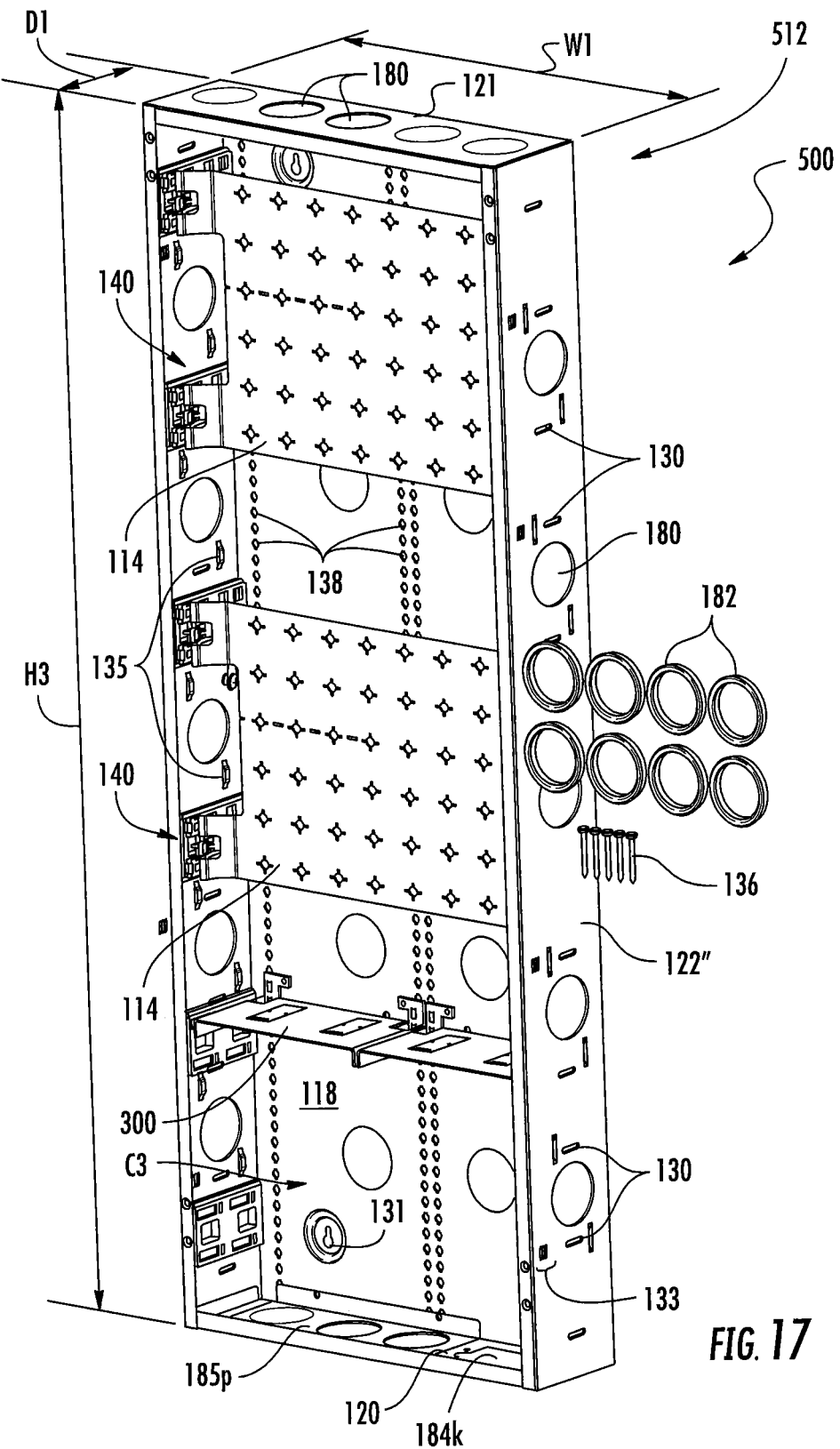
FIG. 17 is a partially exploded perspective view of a media enclosure assembly according to some other embodiments.

A media enclosure assembly 500 according to some embodiments is illustrated in FIG. 17. The assembly 500 includes many components that are the same or substantially the same as the components of the enclosure assemblies 100 and 400. Components that are the same or substantially the same share the same reference number and have been described in detail above.

The assembly 500 includes a housing 512. The housing 512 includes a back wall 112, a bottom wall 120 and an opposite top wall 121, and opposite sidewalls 122". The walls 112, 120, 121, 122" define a cavity C3.

The sidewalls 122" of the housing 512 are taller than the sidewalls 122' of the housing 412 and, as a result, the housing 512 has a height H3 that is greater than the height H2 of the housing 412. In some embodiments, the height H3 is about 28 inches. In some other embodiments, the height H3 is about 40 inches.

A plurality of support plates 114 may be mounted in the housing 512. Each support plate 114 can be mounted in four different positions as described above. The multiple support plates 114 provide even further flexibility for mounting equipment and/or wire management.

As described above, the panel 185p may be removed from the housing 512 such that the power conditioner 200 and associated brackets 220, 224 (FIG. 7) may be dropped in and/or mounted to the housing 512. In some embodiments, the enclosure assembly 500 includes the power conditioner 200.

The shelves 300 of the enclosure assembly 400 (FIG. 14) and the enclosure assembly 500 (FIG. 17) may also be mounted to the support plate(s) 114. Specifically, the shelf hooks 316 (FIG. 9) may be received in the support plate apertures 150 (FIG. 10) and the shelf 300 may be held with the primary shelf surface 302 (FIG. 9) orthogonal to the support plate 114.

The housing 412 (FIG. 14) and the housing 512 (FIG. 17) may be installed in the same way as described above in reference to the housing 112. For example, fasteners 136 may be received through the side wall apertures 130 or the back wall apertures 131 to mount the housing to studs or to a mounting surface, respectively.

In some embodiments, the enclosure assembly 400 and/or the enclosure assembly 500 is UL certified. In some embodiments, enclosure assembly 400 and/or the enclosure assembly 500 is UL 1863 certified.

The enclosure assemblies 100, 400 and 500 can provide improved storage and organization for ever-increasing technology needs. The various features described above including the support plates 114 and the shelves 300 can provide flexibility to organize, easily access and section off areas for users (e.g., cable technicians) to do their work without disrupting other components or connections in the system. As described above, the support plates 114 can be adjusted between several configurations to add and organize equipment or section off areas that the user (e.g., installer or end user) does not want touched. Also, the support plates 114 are pivotable to allow the support plate to swing out for quick and easy access to components.

Moreover, the panel 185p may be removed from the housings 112, 412, 512 to allow a power conditioner to be mounted in the housing. The power conditioner can be used to provide power to and protect equipment mounted to the housing back wall 118 and the support plate 114. The drop-in power conditioner takes up very little space in the housing, thereby saving space for other devices.

Figure 18:
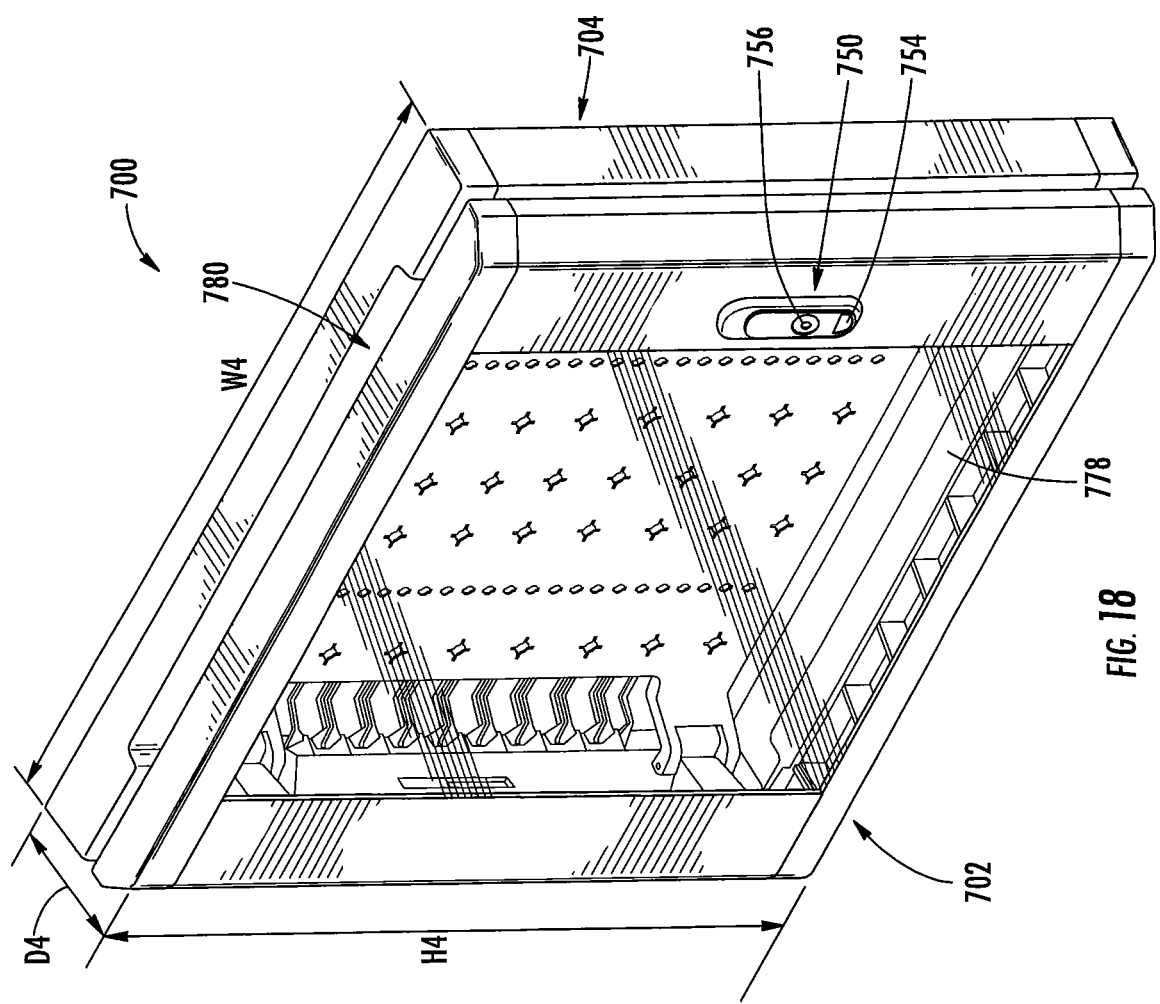
FIG. 18 is a perspective view of a media enclosure door assembly in a closed position according to some embodiments.
Figure 19:
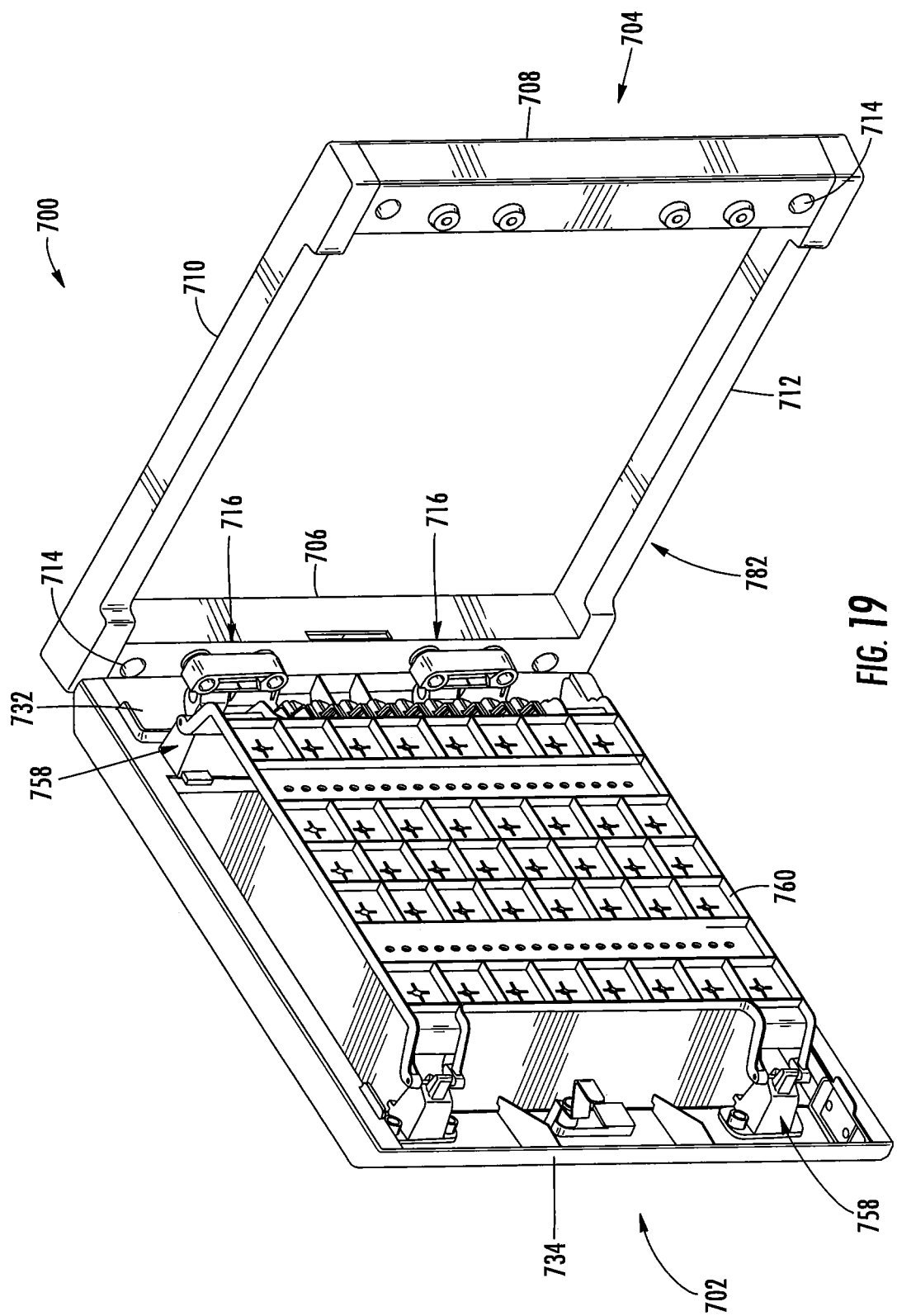
FIG. 19 is a perspective view of the media enclosure door assembly of FIG. 18 in an open position.

An enclosure door assembly 700 according to some embodiments is illustrated in FIGS. 18 and 19. The assembly 700 includes a door 702 that is pivotably coupled to a base 704.

The base 704 includes first and second opposite side portions or panels 706, 708, an upper portion or panel 710 and a lower portion or panel 712. The panels 706, 708, 710, 712 may be collectively referred to as a frame or outer frame. A plurality of apertures 714 are defined in each of the side panels 706, 708.

Fasteners may be received through the apertures 714 to secure the base 704 to a mounting surface such as a wall. As will be described below, the enclosure door assembly 700 may be used with an enclosure which may be recessed in the wall between adjacent studs. In this regard, the base 704 may have a size (width) such that the apertures 714 in the first side panel 706 receive fasteners to mount the base 704 to a first stud and the apertures 714 in the second side panel 708 receive fasteners to mount the base 704 to a second, adjacent stud (e.g., the adjacent studs 34 shown in FIG. 2).

The door 702 and the base 704 are pivotably connected by one or more hinge assemblies 716. As described below, the hinge assemblies 716 may be reversible to change the swing direction of the door 702.

Figure 20:
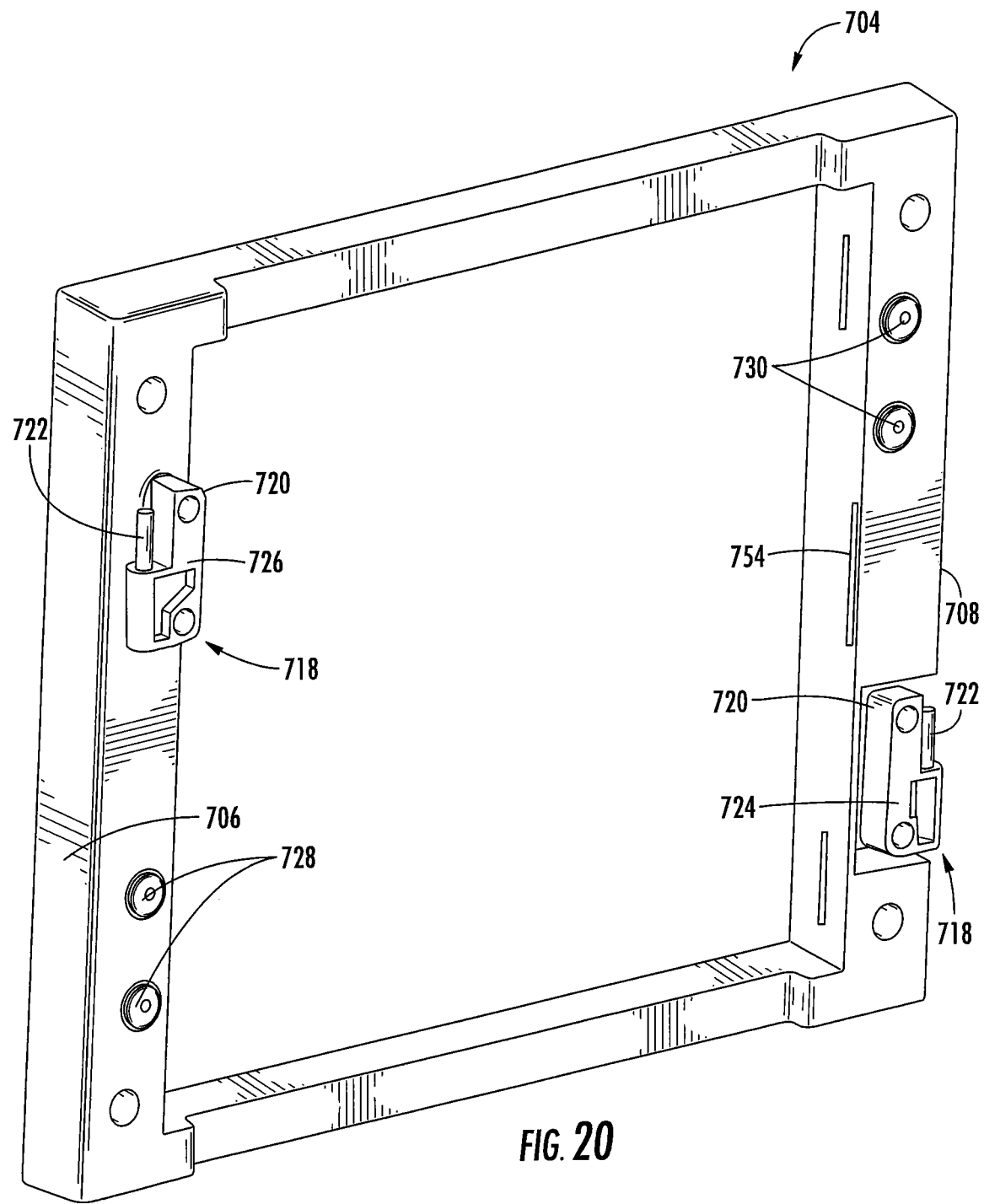
FIG. 20 is a perspective view of a base of the media enclosure door assembly of FIG. 18.

Referring to FIG. 20, each hinge assembly 716 includes a hinge pin member 718 that is connectable to the base 704. The hinge pin member 718 includes a body 720 and a pin 722 extending from the body 720. The body 720 has a first side or surface 724 and an opposite second side or surface 726.

As illustrated in FIG. 19, two hinge assemblies 716 are connected to the first side panel 706. In this configuration, each hinge pin member 718 is connected to the first side panel 706 using connection feature 728 (e.g., apertures defined in the side panel 706 as illustrated in FIG. 20). The first side 724 of the hinge pin member body 720 (FIG. 20) faces and/or contacts the first side panel 706 and the second side 726 of the body 720 (FIG. 20) faces away from the first side panel 706.

The hinge pin members 718 may be removed from the first side panel 706 and connected to second side panel 708. One of the hinge pin members 718 has been moved to the second side panel 708 in FIG. 20. The pin member 718 is connected to the second side panel 708 using connection feature 730 (e.g., apertures defined in the second side panel 708). Before connection, the hinge pin member 718 is flipped such that the first side 724 of the hinge pin member body 720 faces the second side panel 708, the second side 726 of the hinge pin member body 720 faces away from the second side panel 708 and the pin 722 is oriented toward an outer portion of the second side panel 708.

Figure 21:
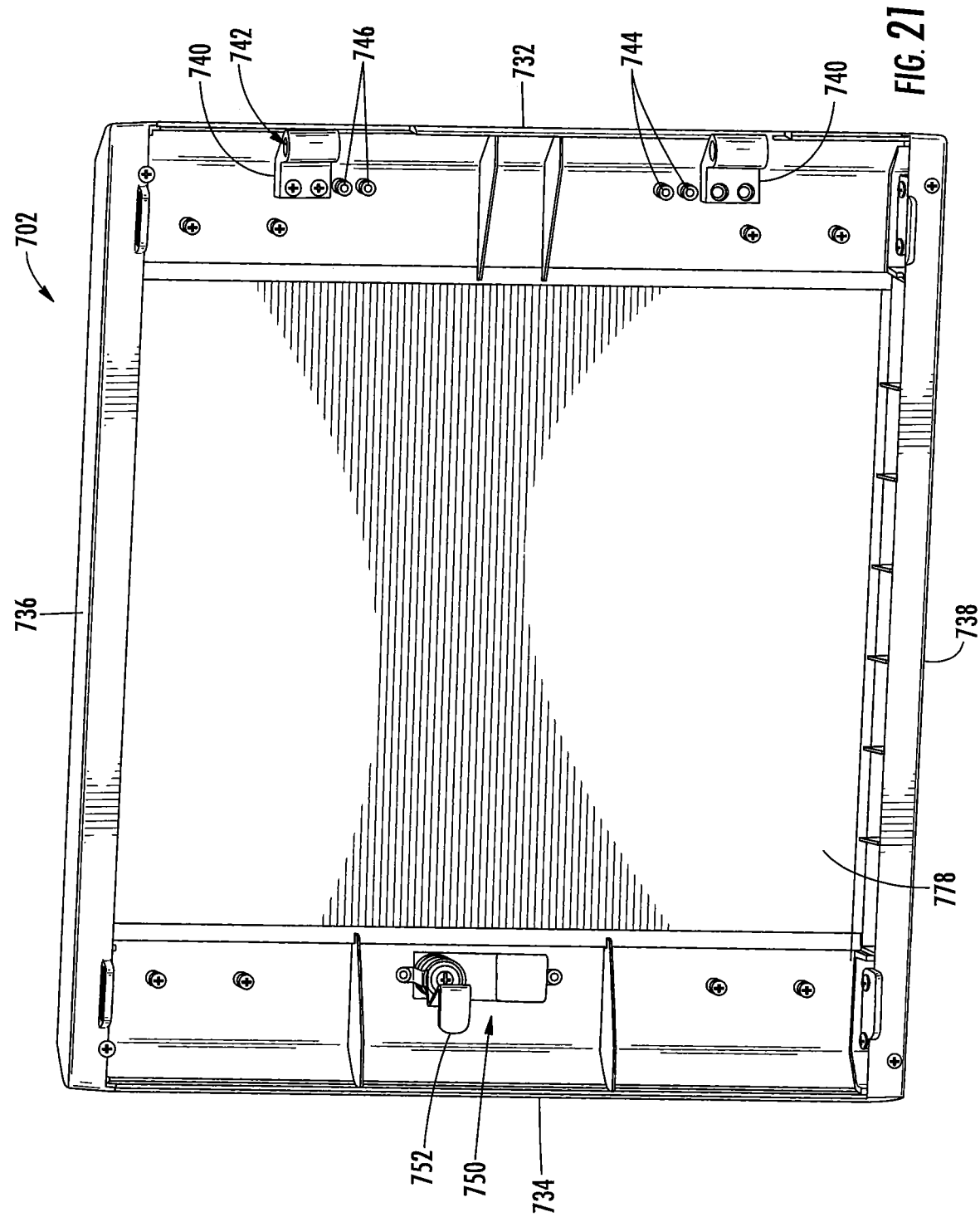
FIG. 21 is a perspective view of a door of the media enclosure door assembly of FIG. 18.

Turning now to FIG. 21, the door 702 includes first and second opposite side (or vertical) portions or panels 732, 734, an upper (or first horizontal) portion or panel 736 and a lower (or second horizontal) portion or panel 738. The panels 732, 734, 736, 738 may be collectively referred to as a frame or outer frame. The hinge assembly 716 (FIG. 19) includes a hinge bracket 740. The hinge bracket includes a channel 742 defined therein. The channel 742 is sized and configured to receive the pin 722 of the hinge pin member 718 (FIG. 20).

The uppermost hinge bracket 740 shown in FIG. 21 positioned as configured in FIG. 19. The hinge bracket 740 is connected to the first side panel 732 using connection feature 744 (e.g., apertures defined in the first side panel 732).

In some embodiments, when the door 702 is to be reversed, the hinge brackets 740 are moved on the first side panel 732. A respective hinge bracket 740 may be moved and connected to connection feature 746 (e.g., apertures) that is adjacent the first connection feature 744. This is illustrated with the lowermost hinge bracket 740 shown in FIG. 21.

Therefore, the swing direction of the door can be reversed prior to installation of the door assembly 700. This may be useful, for example, if the door assembly is being installed near a corner.

Referring to FIGS. 18 and 19, the door 702 is pivotable relative to the base 704 between a closed position (FIG. 18) and an open position (FIG. 19). The door 702 is pivotable about an axis defined by the hinge assemblies 716. In some embodiments, the door is pivotable about an axis defined by the pins 722 (FIG. 20).

Referring to FIGS. 18 and 21, the door 702 includes a latch assembly 750. The latch assembly 750 can help to hold the door 702 in the closed position. The latch assembly 750 includes a latch member 752 that is received in a slot 754 of the base 704 (FIG. 20; note there may be slots on each of the first and second side panels 706, 708 to accommodate reversing the door as described above). The latch assembly 752 includes an actuator 754 (e.g., a button or lever). A user may actuate (e.g., push) the actuator 754 such that the latch member 752 rotates out of the slot 754 of the base 704 (FIG. 20). The user may then pull the door 702 open. In some embodiments, the latch member 752 is biased toward the position shown in FIG. 21 (e.g., by a spring).

The latch assembly 750 may include a lock 756 that allows a user to lock the door 702 in the closed position and unlock the door 702 before opening. The lock 756 may be locked and unlocked using a key.

Referring to FIG. 19, a support plate 760 may be mounted to the door 702. The support plate 760 may be releasably coupled to the door 702 at a plurality of standoffs 758. As illustrated, two spaced apart standoffs 758 are on each of the first and second side panels 732, 734 of the door 702.

Figure 22:
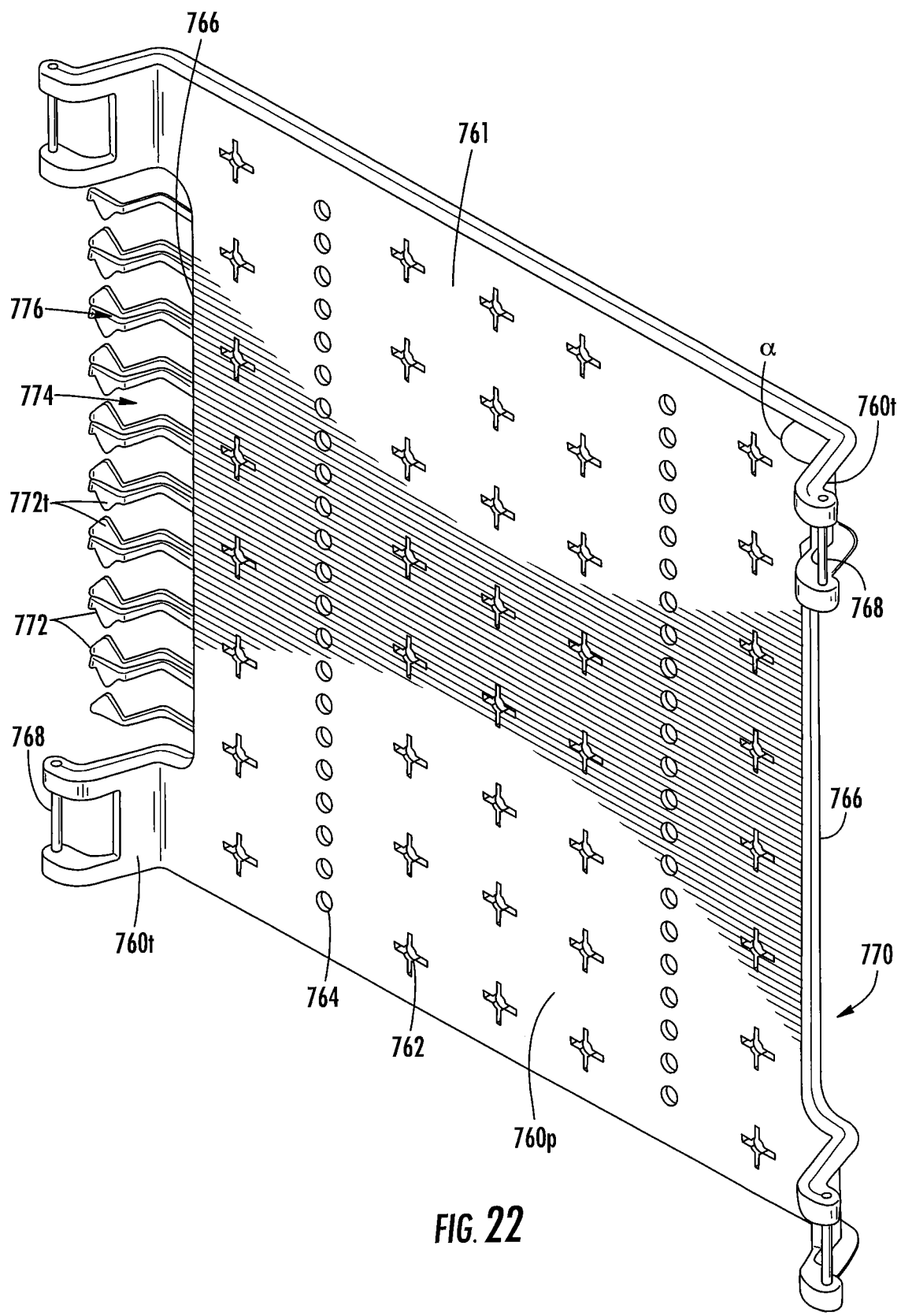
FIG. 22 is a perspective view of a support plate of the media enclosure door assembly of FIG. 18.

FIG. 22 illustrates the support plate 760. The support plate 760 includes a plurality of apertures or perforations 762, 764 extending therethrough. The apertures 762, 764 are for mounting items such as electronic equipment and/or for cable or wire management. In some embodiments, and as illustrated, the apertures 762 may include a center opening and a plurality of elongated slots extending away from the center opening. Clips, hooks, hook and loop fasteners, straps and other mounting features known to those of skill in the art may also be employed in addition to or instead of the apertures 762, 764.

The support plate 760 includes a primary plate member or portion 760p. A pair of tabs or tab members or portions 760t extend away from each one of opposing edge portions 766 of the primary plate member 760p. Each of the tabs 760t is angled relative to the primary plate portion 760p. Specifically, each tab member 760t extends away from the primary plate portion 760p such that an angle α is defined between the primary plate member 760p (or a first side or surface 761 thereof) and the tab 760t. In some embodiments, the angle α is an obtuse angle. A pivot bar 768 is at a distal end of each tab member 760t.

A recess or valley 770 is defined between the tab members 760t at one opposing edge portion 766 of the plate member 760p. The recess 770 may facilitate cable management. The recess 770 may also help a user to grip the support plate to insert, remove and/or pivot the support plate 760 with respect to the standoffs 758 (FIG. 19).

Extending from the other opposing edge portion 766 of the plate member are a plurality of fingers or projections 772. The fingers 772 are arranged to facilitate cable or wire management. At least some of the fingers 772 may be arranged in pairs, with an opening 774 defined between each adjacent pair of fingers 772. The openings 774 may be used to route cable or wire therethrough. A respective finger 772 may include a tip 772t at a distal end thereof. The tips 772t may be arranged to at least partially enclose the openings 774 (e.g., to help retain cable or wire in the openings 774). A smaller opening 776 may be defined between the two fingers 772 in a respective pair. The opening 776 may be used to route smaller wire therethrough. The fingers 772 may be resilient to facilitate routing cable and wire through the openings 774, 776.

The support plate 760 may be formed of any suitable material. For example, the support plate 760 may be formed of a polymeric material such as ABS.

Referring to FIG. 21, the door 702 may include a front panel or window 778. In some embodiments, the window 778 is transparent or semi-transparent. The window 778 may be held between the first and second vertical panels 732, 734 and the first and second horizontal panels 736, 738. The window allows a user to view the status of a device mounted on the support plate 760 (FIG. 19) or another device mounted in an enclosure behind the door assembly 700 (e.g., if the support plate 760 is not used). In some embodiments, the window is tinted. In some embodiments, the window is formed of plexiglass.

The design of the standoffs 758 and/or the support plate 760 having the angled tabs 760t allows the support plate 760 to be mounted in two different configurations or positions.

Figure 23:
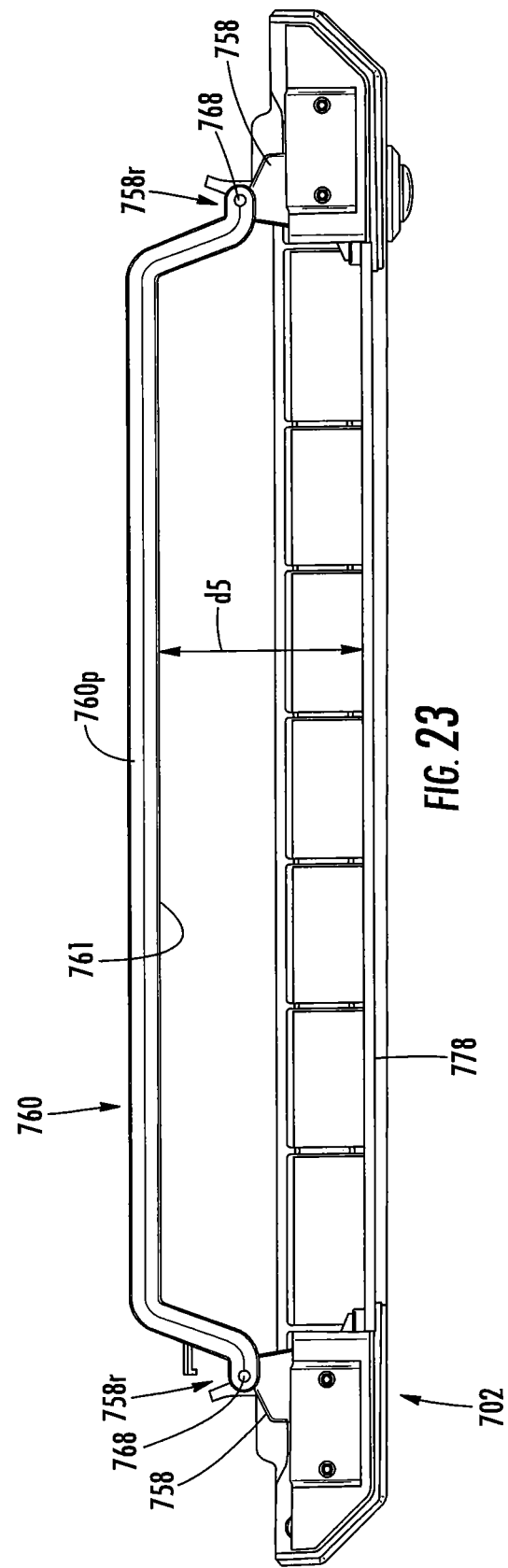
FIGS. 23 and 24 illustrate the support plate of FIG. 22 mounted to the media enclosure door assembly of FIG. 18 in first and second positions, respectively.

The support plate 760 is shown in the first configuration or position in FIG. 23. The support plate pivot bars 768 are received in respective recesses 758r of the standoffs 758. The first surface 761 of the support plate 760 faces the front panel 778 of the door 702. The support plate primary plate portion 760p is spaced apart from the front panel 778 a distance d5.

Figure 24:
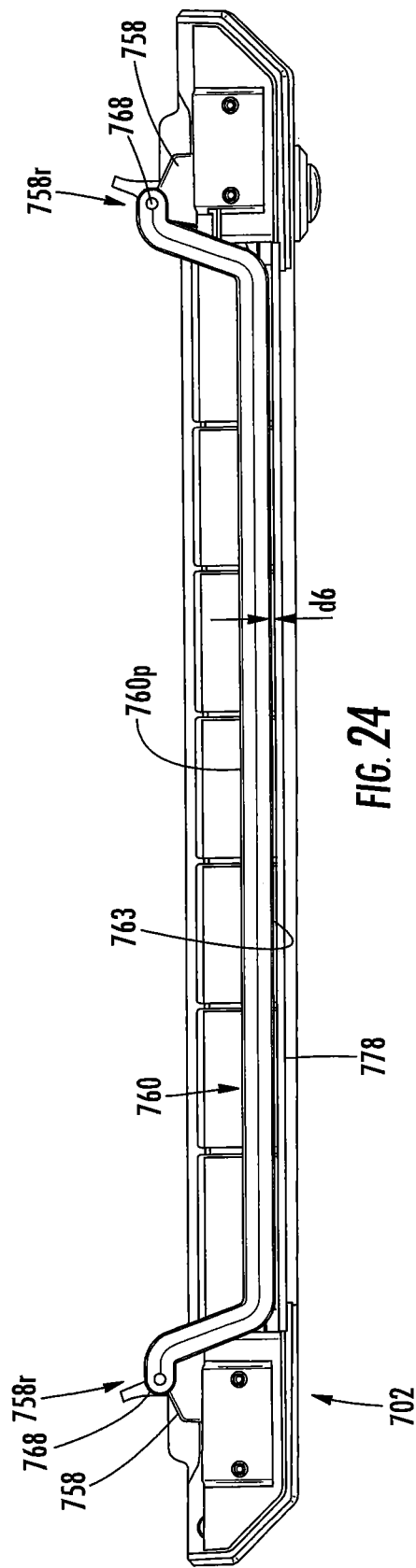

The support plate may be flipped or rotated and installed in the second configuration or position shown in FIG. 24. The support plate pivot bars 768 are again received in respective recesses 758r of the standoffs 758. A second surface 763 of the support plate 760 that is opposite the first surface 761 of the support plate 760 faces the front panel 778 of the door 702. The support plate primary plate portion 760p is spaced apart from the front panel 778 a distance d6. The distance d6 is less than the distance d5. In some embodiments, with the support plate 760 in the second position, the support plate primary plate portion 760p is adjacent the front panel 778 of the door 702.

Referring again to FIG. 18, the enclosure door assembly 700 has a width W4, a depth D4 and a height H4. The width W4 may be between about 17 and 19 inches and, in some embodiments, is about 17.9 inches. The depth D4 may be between about 2 inches and 4 inches and, in some embodiments, is about 2.9 inches. The height may be between about 15 and 17 inches and, in some embodiments, is about 16 inches.

A gap, opening or vent 780 is defined between the door 702 and the base 704 at the top and bottom of the enclosure door assembly 700 with the door 702 in the closed position (FIG. 18). One opening 780 is defined between the upper or first horizontal panel 736 of the door 702 (FIG. 21) and the upper or first horizontal panel 710 of the base 704 (FIG. 19). Another opening 780 is defined between the lower or second horizontal panel 738 of the door 702 (FIG. 21) and the lower or second horizontal panel 712 of the base 704 (FIG. 19). As illustrated in FIG. 19, each of the horizontal panels 710, 712 of the base 704 may include a recess 782 that defines at least a portion of the opening 780.

The openings 780 facilitate ventilation for components that are mounted to the enclosure door assembly 700 and/or components that are in an underlying enclosure. In addition, a user can run thick cables or lines (e.g., trunk lines) through the openings 780.

The door 702 and the base 704 may be formed of any suitable material. In some embodiments, the door 702 and the base 704 are formed of a polymeric material such as ABS. The use of certain polymeric materials such as ABS helps to minimize signal interference when using routers or other wireless devices that are mounted to the enclosure door assembly 700 and/or components that are in an underlying enclosure (e.g., as opposed to using metal for the enclosure door assembly 700). As noted above, the front panel or window 778 may be formed of plexiglass which also helps minimize signal interference.

Figure 25:
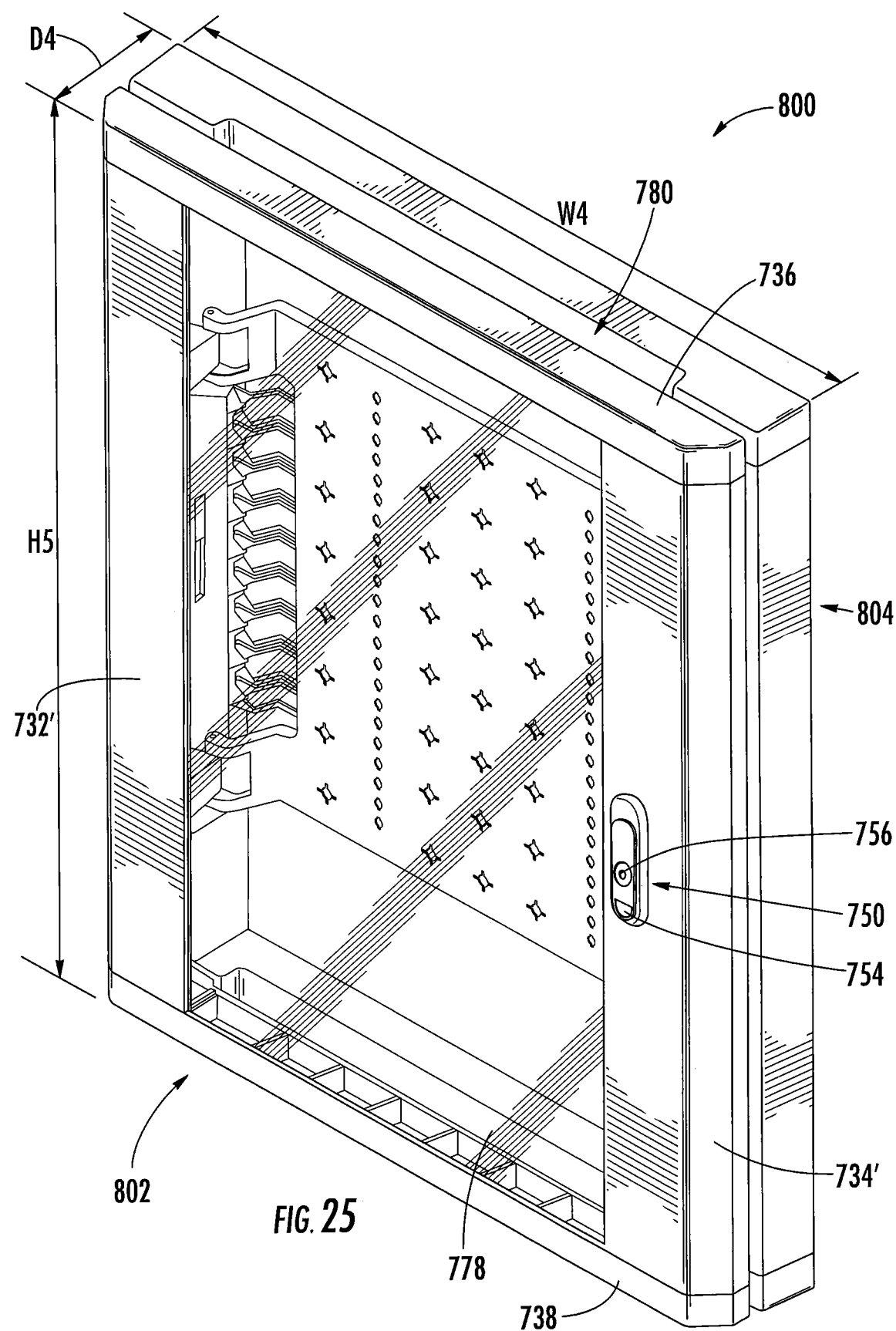
FIG. 25 is a perspective view of a media enclosure door assembly in a closed position according to some other embodiments.
Figure 26:
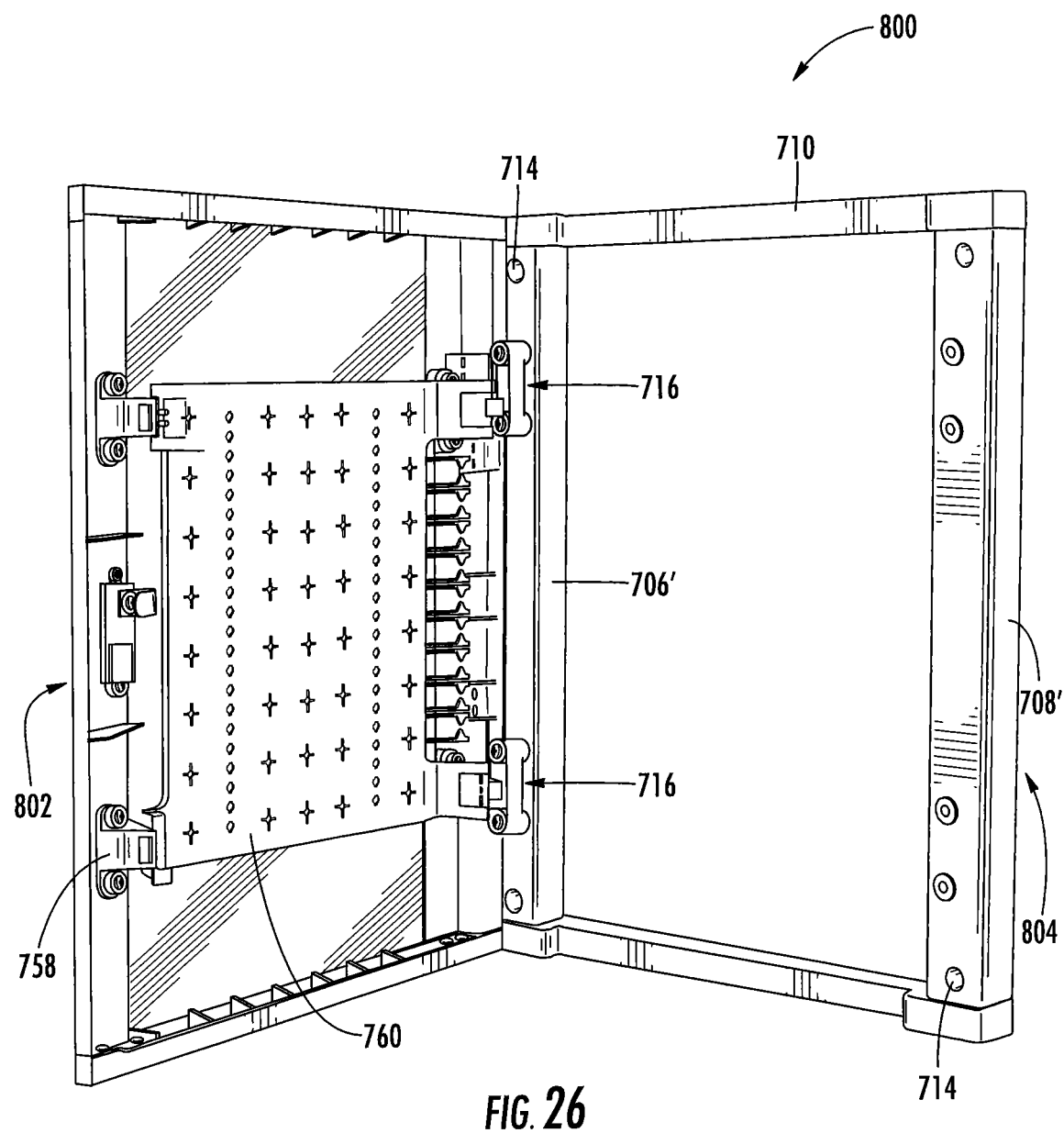
FIG. 26 is a perspective view of the media enclosure door assembly of FIG. 25 in an open position.

A media enclosure door assembly 800 according to some embodiments is illustrated in FIGS. 25 and 26. The assembly 800 includes many components that are the same or substantially the same as the components of the enclosure door assembly 700. Components that are the same or substantially the same share the same reference number and have been described in detail above.

The assembly 800 includes a door 802 pivotably coupled to a base 804. The side or vertical panels 732', 734' of the door 802 are taller than the side or vertical panels 732, 734 of the door 702 of the door assembly 700. Likewise, the side or vertical panels 706', 708' of the base 804 are taller than the side or vertical panels 706, 708 of the base 704 of the door assembly 700. As a result, the assembly 800 has a height H5 that is greater than the height H4 of the assembly 700. The height H5 may be between about 21 and 23 inches and, in some embodiments, is about 22 inches.

The door 802 and the base 804 may be formed of any suitable material. In some embodiments, the door 802 and the base 804 are formed of a polymeric material such as ABS. The use of certain polymeric materials such as ABS can help to minimize signal interference as described above.

Figure 27:
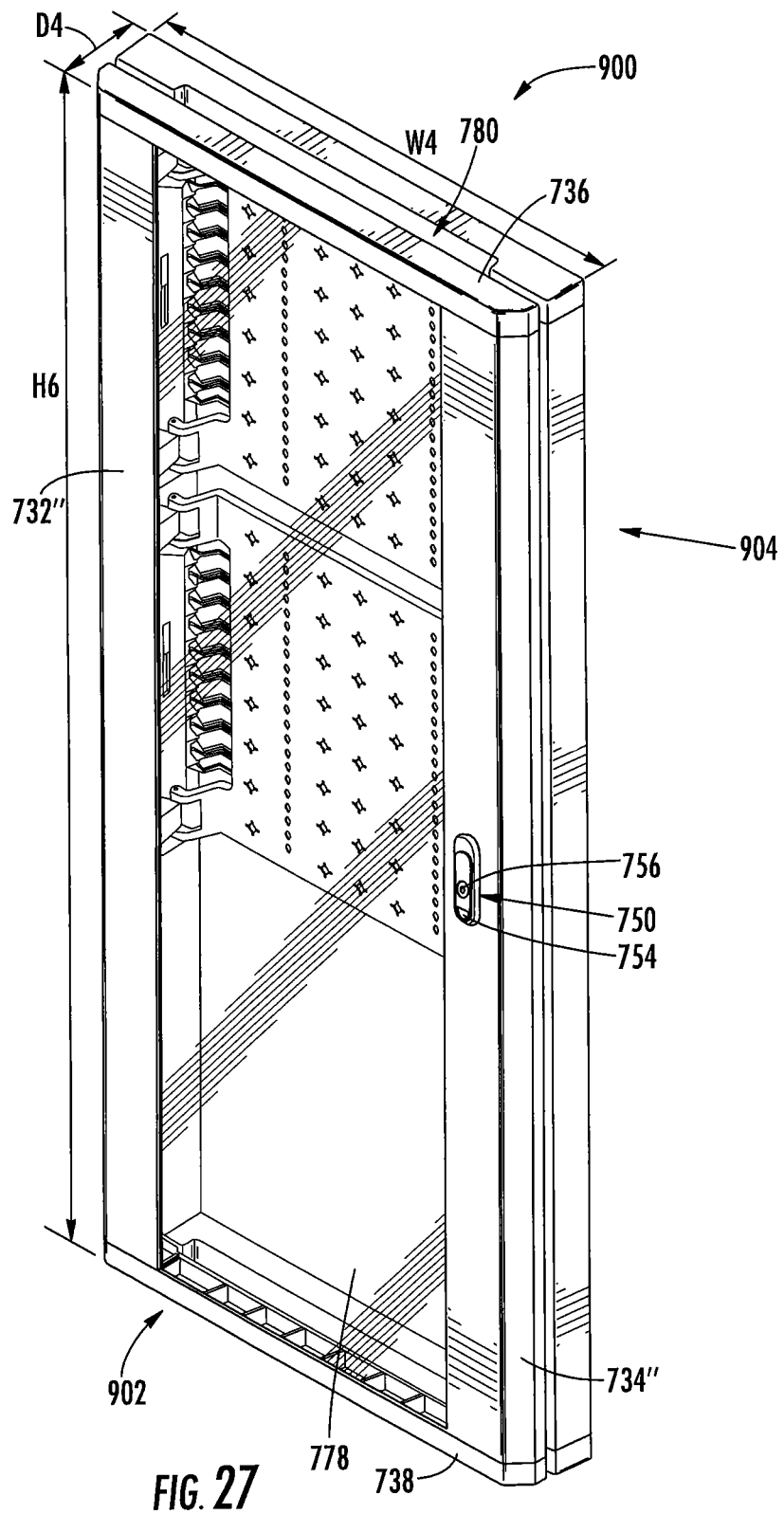
FIG. 27 is a perspective view of a media enclosure door assembly in a closed position according to some other embodiments.
Figure 28:
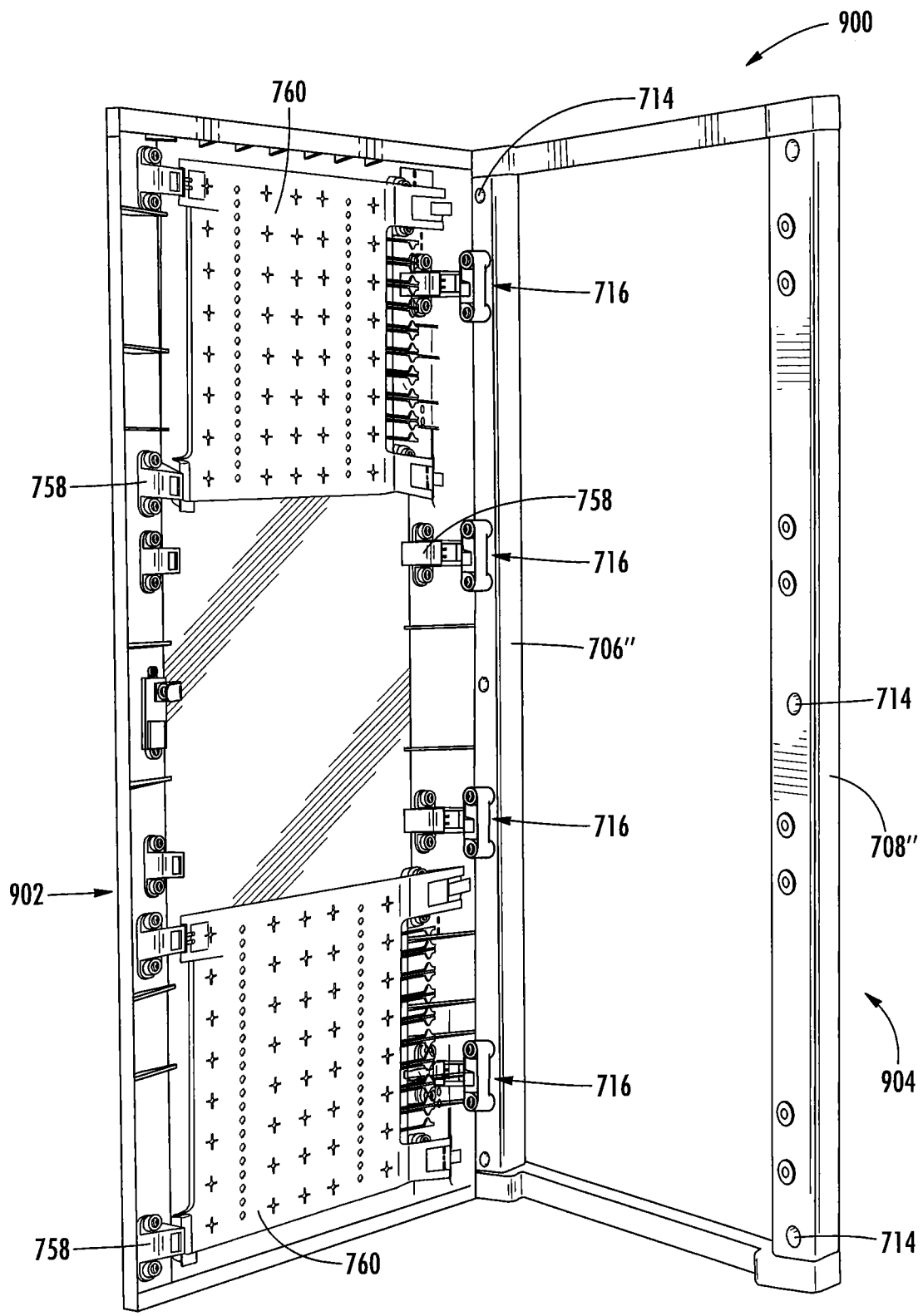
FIG. 28 is a perspective view of the media enclosure door assembly of FIG. 27 in an open position.

A media enclosure door assembly 900 according to some embodiments is illustrated in FIGS. 27 and 28. The assembly 900 includes many components that are the same or substantially the same as the components of the enclosure door assemblies 700 and 800. Components that are the same or substantially the same share the same reference number and have been described in detail above.

The assembly 900 includes a door 902 pivotably coupled to a base 904. The side or vertical panels 732", 734" of the door 902 are taller than the side or vertical panels 732', 734' of the door 802 of the door assembly 800. Likewise, the side or vertical panels 706", 708" of the base 904 are taller than the side or vertical panels 706', 708' of the base 804 of the door assembly 800. As a result, the assembly 900 has a height H6 that is greater than the height H5 of the assembly 800. In some embodiments, the height H6 may be between about 29 and 31 inches and, in some particular embodiments, is about 30 inches. In some other embodiments, the height H6 may be between about 41 and 43 inches and, in some particular embodiments, is about 42 inches.

A plurality of support plates 760 may be mounted to the door 902. Each support plate 760 can be mounted in two different positions as described above. The multiple support plates 760 may provide even further flexibility for mounting equipment and/or wire management.

The door 902 and the base 904 may be formed of any suitable material. In some embodiments, the door 902 and the base 904 are formed of a polymeric material such as ABS. The use of certain polymeric materials such as ABS can help to minimize signal interference as described above.

The enclosure door assemblies 700, 800 and 900 are configured to be used with media enclosures. The door assemblies 700, 800 and 900 include features that reduce the need for accessories such as brackets or shelves in the media enclosure. The door assemblies 700, 800 and 900 stand off the wall, giving the user an additional room for equipment. In some embodiments, the assemblies 700, 800 and 900 have a depth of about three inches, thereby providing about three inches extra space.

In some embodiments, the base and the door of the assemblies 700, 800 and 900 stand off the wall such that the support plate(s) 760 are spaced apart from a plane defined by the wall when the assemblies 700, 800 and 900 are in the closed position. In other words, in some embodiments, the support plate(s) 760 reside in front of the wall or the plane defined by the wall when the door 702, 802 or 902 is in the closed position.

The enclosure door assemblies 700, 800 and 900 may attach directly to a wall rather than to the underlying enclosure itself. This facilitates retrofitting over an existing enclosure.

The enclosure door assemblies 700, 800 and 900 may be sized and configured to fit over the media enclosure assemblies 100, 400 and 500, respectively. For example, referring to FIG. 29, the housing 412 of the media enclosure assembly 400 is recessed in the mounting surface or wall 32 and the enclosure door assembly 800 is mounted to the mounting surface or wall 32 such that the base 804 of the enclosure door assembly 800 surrounds the housing 412.

Figure 29:
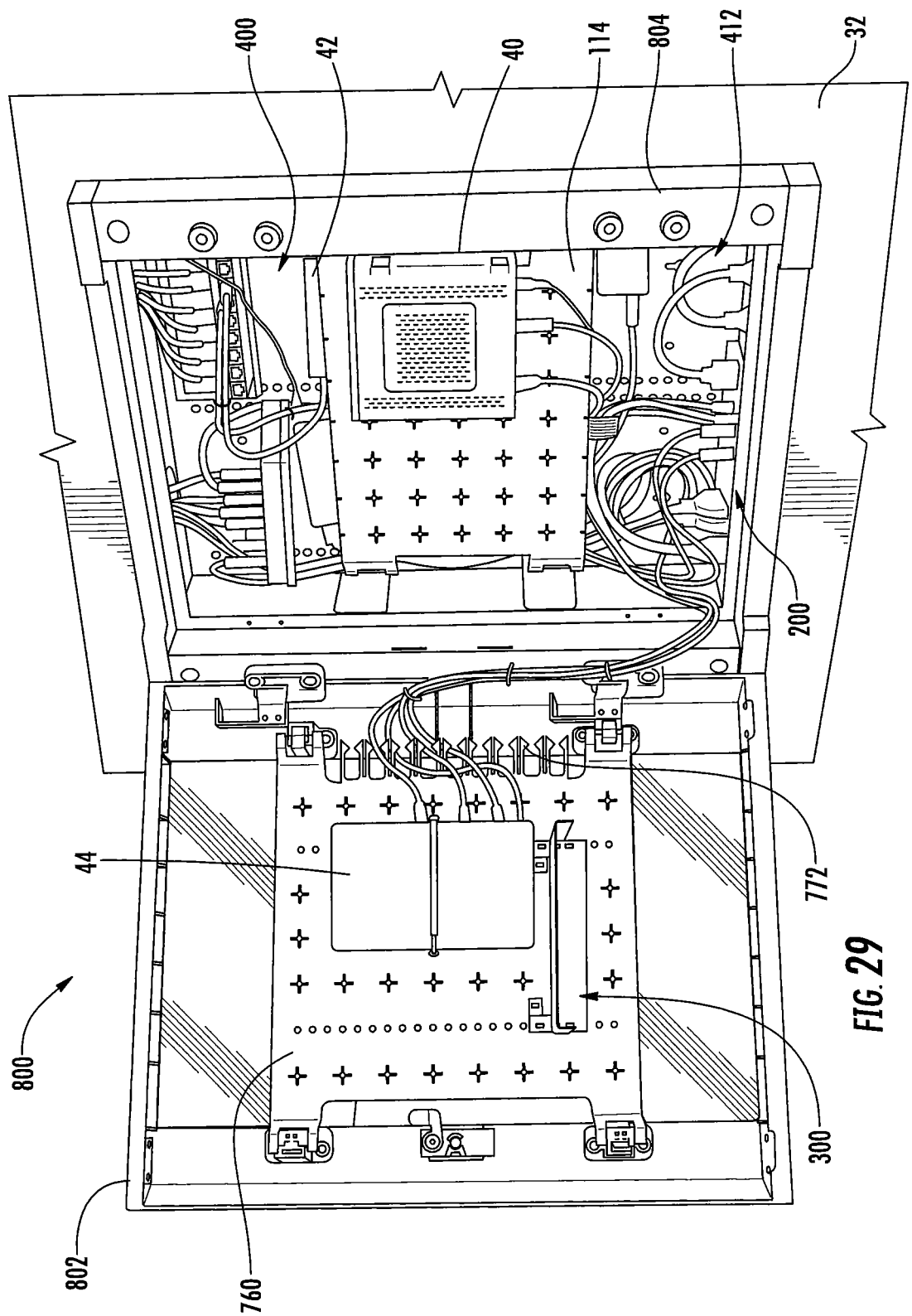
FIG. 29 is a perspective view of an assembly including the media enclosure assembly of FIG. 10 and the media enclosure door assembly of FIG. 25.

FIG. 29 illustrates certain advantages of the media enclosure assemblies and the enclosure door assemblies described herein. The drop-in power conditioner 200 is mounted in the housing 412 of the media enclosure assembly 400 to power and/or provide power conditioning to devices while taking up very little space. The support plate 114 is mounted in the housing 412 in one of a plurality of different selectable positions and an electronic device 40 is mounted to the support plate. Additional electronic devices such as the device 42 may be mounted to the back wall of the housing 412 (i.e., the housing 412 and the support plate 114 provide two mounting layers).

The support plate 760 is mounted to the door 802 of the enclosure door assembly 800 in one of two different selectable positions. A router or wireless access point device 44 is mounted or otherwise connected to the support plate 760. The support plate projections 772 are used for cable or wire management.

The base 804 of the enclosure door assembly 800 is mounted to the wall 32 rather than the enclosure housing 412. The enclosure door assembly 800 stands off the wall 32 to provide additional space for equipment such as the router 44.

One or more of the shelves 300 may be connected to the support plate 760 of the enclosure door assembly 800 (e.g., using the apertures 762 and/or 764 shown in FIG. 22). The shelves 300 may be used to hold equipment and/or for additional cable or wire management as described above. In some embodiments, the enclosure door assemblies 700, 800 and/or 900 include one or more shelves 300.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A structured media enclosure assembly comprising:
a housing comprising a back wall, a bottom wall, a top wall, and first and second sidewalls defining a cavity;
a support plate releasably held in the housing and comprising a primary plate portion that is parallel to and spaced apart from the back wall, the support plate including a plurality of apertures defined in the primary plate portion for mounting electronic components to the support plate; and
at least one mounting feature at each of the first and second sidewalls;
wherein the housing is sized to fit between first and second adjacent studs with the first sidewall mounted to the first stud using the at least one mounting feature on the first sidewall and with the second sidewall mounted to the second stud using the at least one mounting feature on the second sidewall; and
wherein the support plate is releasably held in the housing at two locations on the first sidewall and at two locations on the second sidewall.

2. The structured media enclosure assembly of claim 1 wherein the support plate is configured such that the support plate can be selectively positioned in the housing cavity:
in a first position with the primary plate portion spaced apart from the back wall a first distance;
in a second position with the primary plate portion spaced apart from the back wall a second distance that is less than the first distance.

3. The structured media enclosure assembly of claim 2 wherein the support plate is configured such that the support plate can be selectively positioned in the housing cavity:
in a third position with the primary plate portion spaced apart from the back wall a third distance that is less than the second distance.

4. The structured media enclosure assembly of claim 1 wherein each of the top wall and the bottom wall include at least one knockout that is configured to be selectively removed from the housing.

5. The structured media enclosure assembly of claim 1 wherein the enclosure assembly further comprises a removable panel on the bottom wall of the housing, the removable panel configured to be removed to expose an opening sized and configured to receive a power conditioner with the power conditioner held at the bottom wall of the housing.

6. The structured media enclosure assembly of claim 5 in combination with a power conditioner comprising a housing having a front surface, wherein a major portion of the power conditioner housing is received through the opening and the power conditioner is held in the housing with the front surface of the power conditioner housing adjacent the bottom wall of the enclosure assembly housing.

7. The structured media enclosure assembly of claim 1 further comprising at least one shelf releasably connected to the back wall of the housing, the at least one shelf comprising a primary shelf surface that extends away from and is substantially orthogonal to the back wall of the housing.

8. The structured media enclosure assembly of claim 7 wherein the at least one shelf comprises at least one support arm having a hinge portion at a front portion of the primary shelf surface and releasably connected to the primary shelf surface by at least one release member, the at least one release member configured to be removed such that the support arm can be rotated upwardly about the hinge portion to an upright position with the support arm substantially perpendicular to the primary shelf surface.

9. A structured media enclosure and power conditioner assembly comprising:
a housing comprising a back wall, a bottom wall, a top wall, and first and second sidewalls defining a cavity;
a power conditioner;
an opening in the bottom wall of the housing, wherein the opening and the power conditioner are sized and configured such that the power conditioner can be received through the opening and held at the bottom wall of the housing in an installed position;
at least one mounting feature at each of the first and second sidewalls;
wherein the housing is sized to fit between first and second adjacent studs with the first sidewall mounted to the first stud using the at least one mounting feature on the first sidewall and with the second sidewall mounted to the second stud using the at least one mounting feature on the second sidewall.

10. The structured media enclosure and power conditioner assembly of claim 9 further comprising a removable panel on the bottom wall of the housing, the removable panel configured to be removed to expose the opening in the bottom wall of the housing.

11. The structured media enclosure and power conditioner assembly of claim 9 wherein the power conditioner comprises a housing having a bottom surface, a top surface and a front surface, the assembly further comprising a first bracket attached to the bottom surface of the housing and a second bracket attached to a top surface of the power conditioner, wherein the first bracket is connectable to one of the back and bottom walls of the equipment box housing and the second bracket is connectable to the other one of the back and bottom walls of the equipment box housing in the installed position.

12. The structured media enclosure and power conditioner assembly of claim 9 wherein the power conditioner comprises a housing having a front surface, and wherein a major portion of the power conditioner housing extends through the opening and below the bottom wall of the equipment box housing and the front surface of the power conditioner housing is adjacent the bottom wall of the equipment box housing in the installed position.

* * * * *